(12) United States Patent
Machado et al.

(10) Patent No.: US 7,662,001 B2
(45) Date of Patent: Feb. 16, 2010

(54) ELECTRICAL CONNECTOR ASSEMBLY

(75) Inventors: Manuel Machado, Hope, RI (US);
Simon Sullivan, Bugbrooke (GB);
Matthew Jarod Scherer, Kingston, RI (US); Stephen Antaya, West Kingston, RI (US)

(73) Assignee: Antaya Technologies Corporation, Cranston, RI (US)

( * ) Notice: Subject to any disclaimer, the term of this patent is extended or adjusted under 35 U.S.C. 154(b) by 0 days.

(21) Appl. No.: 11/803,017

(22) Filed: May 11, 2007

(65) Prior Publication Data
US 2007/0287322 A1    Dec. 13, 2007

Related U.S. Application Data

(60) Provisional application No. 60/800,534, filed on May 15, 2006, provisional application No. 60/849,633, filed on Oct. 5, 2006, provisional application No. 60/920,382, filed on Mar. 28, 2007.

(51) Int. Cl.
*H01R 13/11* (2006.01)
(52) U.S. Cl. .................................................. 439/855
(58) Field of Classification Search ................ 439/855, 439/860, 868, 869, 225, 854, 857, 578, 581
See application file for complete search history.

(56) References Cited

U.S. PATENT DOCUMENTS

| | | | |
|---|---|---|---|
| 3,980,388 A * | 9/1976 | Nailor, III | 439/752 |
| 4,392,009 A | 7/1983 | Napoli | |
| 4,433,200 A | 2/1984 | Jester et al. | |
| 4,460,232 A | 7/1984 | Sotolongo | |
| 5,110,369 A | 5/1992 | Tornstrom et al. | |
| 5,280,133 A | 1/1994 | Nath | |
| 5,290,366 A | 3/1994 | Riermeier et al. | |
| 5,513,075 A * | 4/1996 | Capper et al. | 361/773 |
| 5,616,185 A | 4/1997 | Kukulka | |
| 5,961,740 A | 10/1999 | Wambach et al. | |
| 5,997,367 A * | 12/1999 | Nowak et al. | 439/853 |
| 6,075,201 A | 6/2000 | Wambach | |
| 6,235,984 B1 | 5/2001 | Wambach et al. | |
| 6,307,144 B1 | 10/2001 | Mimura et al. | |
| 6,307,515 B1 * | 10/2001 | Sauer et al. | 343/713 |
| 6,337,436 B1 | 1/2002 | Ganz | |
| 6,344,612 B1 | 2/2002 | Kuwahara et al. | |
| 6,360,497 B1 | 3/2002 | Nakazima et al. | |
| 6,365,824 B1 | 4/2002 | Nakazima et al. | |
| 6,428,355 B1 * | 8/2002 | Machado | 439/578 |
| 6,453,629 B1 | 9/2002 | Nakazima et al. | |
| 6,476,314 B2 | 11/2002 | Bauman et al. | |

(Continued)

FOREIGN PATENT DOCUMENTS

DE    93 20 414 U1    9/1994

(Continued)

*Primary Examiner*—Alexander Gilman
(74) *Attorney, Agent, or Firm*—Hamilton, Brook, Smith & Reynolds, P.C.

(57) ABSTRACT

An electrical connector assembly including a mounting ring having an interior region, a sealing surface at one axial end for securing to a surface, and a securement rim at an opposite axial end. A connector body having engagement surfaces can engage and seal to the mounting ring. The connector body can include electrical terminals extending into the interior region of the mounting ring for engaging mating electrical terminals.

16 Claims, 24 Drawing Sheets

U.S. PATENT DOCUMENTS

| | | |
|---|---|---|
| 6,489,522 B2 | 12/2002 | Yamawaki et al. |
| 6,506,970 B2 | 1/2003 | Yamawaki |
| 6,582,249 B1 | 6/2003 | Boeck et al. |
| 6,676,455 B2 * | 1/2004 | Machado ............... 439/855 |
| 6,921,302 B1 * | 7/2005 | Swantner et al. ........ 439/855 |
| 7,002,813 B2 | 2/2006 | Bergmann et al. |
| 2004/0047118 A1 * | 3/2004 | Bergmann et al. ........ 361/683 |
| 2005/0022859 A1 | 2/2005 | Nass et al. |
| 2005/0054244 A1 | 3/2005 | Werner et al. |
| 2005/0236031 A1 | 10/2005 | Higashikozono et al. |
| 2005/0268958 A1 | 12/2005 | Aoyama |
| 2006/0000504 A1 | 1/2006 | Feldmeier et al. |
| 2006/0042680 A1 | 3/2006 | Korman et al. |

FOREIGN PATENT DOCUMENTS

FR     2 784 509     4/2000

* cited by examiner

ELECTRICAL CONNECTOR ASSEMBLY

RELATED APPLICATIONS

This application claims the benefit of U.S. Provisional Application No. 60/800,534, filed on May 15, 2006, U.S. Provisional Application No. 60/849,633, filed on Oct. 5, 2006, and U.S. Provisional Application No. 60/920,382, filed on Mar. 28, 2007. The entire teachings of the above applications are incorporated herein by reference.

BACKGROUND

Solar panels are typically electrically connected together on site during installation. Current methods tend to be labor intensive and may include soldering on site. As a result, installation can be time consuming.

SUMMARY

The present invention can provide an electrical connector assembly that can allow solar panels to be electrically connected together easily and quickly.

The electrical connector assembly can include a mounting ring having an interior region, a sealing surface at one axial end for securing to a surface, and a securement rim at an opposite axial end. A connector body having engagement surfaces can engage and seal to the mounting ring. The connector body can include electrical terminals extending into the interior region of the mounting ring for engaging mating electrical terminals.

In particular embodiments, the connector body can engage and lock to the securement rim of the mounting ring. The mounting ring can include an adhesive layer on the sealing surface. The mounting ring can engage a recess in the connector body. The connector body can include an adhesive layer. The electrical terminals can include at least four female electrical terminals with circular resilient sockets. The female electrical terminals can be electrically connected in electrical circuitry including bypass circuitry. The electrical circuitry can include diodes. A removable cover can provide access to the electrical circuitry. The electrical terminals can be electrically connected to cables extending from the connector body. The electrical connector assembly can further include a solar panel having an electrical connection region with protruding circular male terminals. The mounting ring can be secured around the electrical connection region whereby the circular male terminals protrude into the interior region of the mounting ring for engagement with female electrical terminals of the connector body which have circular resilient sockets. A laminating material can be applied and can be turned into liquid form to surround the mounting ring. The mounting ring can block entry of the laminating material into the electrical connection region.

The present invention can also provide an electrical connector assembly including an electrical connector body and female electrical terminals with circular resilient sockets contained within the body. The circular resilient sockets can be positioned along an electrical engagement face of the body. The electrical engagement face can have a planar sealing surface surrounding the circular resilient sockets for engaging a surface and sealing around the circular resilient sockets.

In particular embodiments, an adhesive layer can be included on the planar sealing surface. The female electrical terminals can be electrically connected in electrical circuitry including bypass circuitry. The electrical circuitry can include diodes. The electrical terminals can be electrically connected to a circuit board containing the electrical circuitry. A removable cover can provide access to the electrical circuitry. The electrical cables can be electrically connected to the electrical terminals and extend from the connector body. The electrical connector assembly can further include a solar panel having an electrical connection region with protruding circular male terminals for engagement with the circular resilient sockets of the female electrical terminals. The solar panel can include laminating material. The connector body can be positioned within a hole in the laminating material for engaging the circular male terminals. The circular male terminals can be located at a bottom of the hole.

The present invention can also provide an electrical connector assembly including an enclosed housing having an openable access cover covering an access opening. An electrical engagement face can be positioned on the housing opposite to the access opening. At least one electrical connection opening can extend through the electrical engagement face. An electrical connector board can have electrical terminals secured thereon and can be insertable within the housing through the access opening. A self locking and alignment arrangement can lock the electrical connector board within the housing and align the electrical terminals with the at least one electrical connection opening of the electrical engagement face for engaging mating electrical terminals protruding through the at least one opening in the electrical engagement face.

In particular embodiments, an adhesive layer can be on the electrical engagement face and surround the at least one opening for securing the housing to a surface. A pressure relief valve can be included on the housing for relieving pressure differences within the housing. The electrical terminals on the electrical connector board can be female electrical terminals with circular resilient sockets. The at least one electrical connection opening can include a series of electrical connection openings. The circular resilient sockets can be aligned with corresponding electrical connection openings. The female electrical terminals can be electrically connected in electrical circuitry including bypass circuitry. The electrical circuitry can include diodes. The electrical terminals can be electrically connected to a circuit board containing the electrical circuitry. The electrical terminals can be mounted to the electrical connection connector board in alignment with visual alignment holes extending through the electrical connector board for allowing visual alignment of the circular resilient sockets with mating male electrical terminals. The locking and alignment arrangement can include self-locking protrusions extending from the housing which engage corresponding locking holes in the electrical connector board. The electrical connector assembly can also include a solar panel having an electrical connection region with protruding circular male terminals extending through corresponding electrical connection openings in the electrical engagement face for engagement with the circular resilient sockets of the female electrical terminals. The solar panel can include laminating material. The housing can be positioned within a hole in the laminating material from engaging the circular male terminals. The circular male terminals can be located at a bottom of the hole.

The present invention can also provide a method of forming an electrical connection with an electrical connector assembly having a mounting ring and a connector body. The mounting ring can be secured to a surface. The mounting ring can have an interior region, a sealing surface at one axial end for securing to the surface, and a securement rim at an opposite axial end. Engagement surfaces of the connector body can be engaged and sealed to the mounting ring. The connector body can include electrical terminals extending into the interior region of the mounting ring which engage mating electrical terminals protruding from the surface into the interior of the mounting ring.

In particular embodiments, the connector body can be engaged and locked to the securement rim of the mounting ring. The mounting ring can be secured to the surface with an adhesive layer on the sealing surface. The mounting ring can be engaged in a recess in the connector body. The connector body can be provided with an adhesive layer. The electrical terminals include at least four female electrical terminals having circular resilient sockets. The female electrical terminals can be electrically connected in electrical circuitry including bypass circuitry. An electrical circuitry can include diodes. A removable cover can provide access to the electrical circuitry. The electrical terminals can be electrically connected to cables extending from the connector body. The mounting ring can be secured around an electrical connection region of a solar panel having circular male terminals which protrude into the interior region of the mounting ring and engage female electrical terminals of the connector body having circular resilient sockets. Laminating material can be applied and can be turned into liquid form to surround the mounting ring. The mounting ring can block entry of the laminating material into the electrical connection region.

The present invention can also provide a method of forming an electrical connection with an electrical connector assembly. Female electrical terminals with circular resilient sockets can be contained within an electrical connector body. The circular resilient sockets can be positioned along an electrical engagement face of the body. The Electrical engagement face can have a planar sealing surface surrounding the circular resilient sockets. The sealing surface of the electrical engagement face can engage a surface for sealing around the circular resilient sockets and for electrically engaging the circular resilient sockets with mating male circular terminals protruding from the surface.

In particular embodiments, the electrical engagement face can be secured to the surface with an adhesive layer on the planar sealing surface. The female electrical terminals can be electrically connected in electrical circuitry including bypass circuitry. The electrical circuitry can include diodes. The female electrical terminals can be electrically connected to a circuit board containing the electrical circuitry. A removable cover can provide access to the electrical circuitry. The female electrical terminals can be electrically connected to electrical cables extending from the connector body. The electrical connector body can be electrically connected to a solar panel having an electrical connection region at which the mating circular male terminals protrude from the surface. The solar panel can include laminating material and the connector body can be positioned within a hole in the laminating material for engaging the circular male terminals. The circular male terminals can be located at a bottom of the hole.

The present invention can also provide method of forming an electrical connection with an electrical connector assembly in which an enclosed housing can be provided having an openable access cover covering an access opening. An electrical engagement face can be positioned on the housing opposite the access opening. At least one electrical connection opening can extend through the electrical engagement face. An electrical connector board having electrical terminals secured thereon can be inserted within the housing through the access opening. The electrical connector board can be locked within the housing and align the electrical terminals with the at least one electrical connection opening of the electrical engagement face with a self-locking and alignment arrangement, to engage mating electrical terminals that protrude through the at least one electrical connection opening in the electrical engagement face.

In particular embodiments, the housing can be secured to a surface with an adhesive layer on the electrical engagement face surrounding the at least one electrical connection opening. Pressure differences within the housing can be relieved by a pressure relief valve. The electrical terminals on the electrical connector board can be female electrical terminals with circular resilient sockets. The at least one electrical connection opening can include a series of electrical connection openings. The circular resilient sockets can be aligned with corresponding electrical connection openings. The female electrical terminals can be electrically connected in electrical circuitry including bypass circuitry. The electrical circuitry can include diodes. The female electrical terminals can be electrically connected to a circuit board containing the electrical circuitry. The female electrical terminals can be mounted to the electrical connector board in alignment with visual alignment holes extending through the electrical connector board for allowing visual alignment of the circular resilient sockets with mating male electrical terminals. Self-locking protrusions of the self-locking and alignment arrangement can extend from the housing and engage corresponding locking holes in the electrical connector board. The housing can be electrically connected to a solar panel having an electrical connection region at which the mating electrical terminals are circular male terminals protruding from the surface at the electrical connection region into respective electrical connection openings for engaging corresponding circular resilient sockets. The solar panel can include laminating material. The housing can be positioned within a hole in the laminating material for engaging the circular male terminals. The circular male terminals can be located at a bottom of the hole.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

Figure 1:
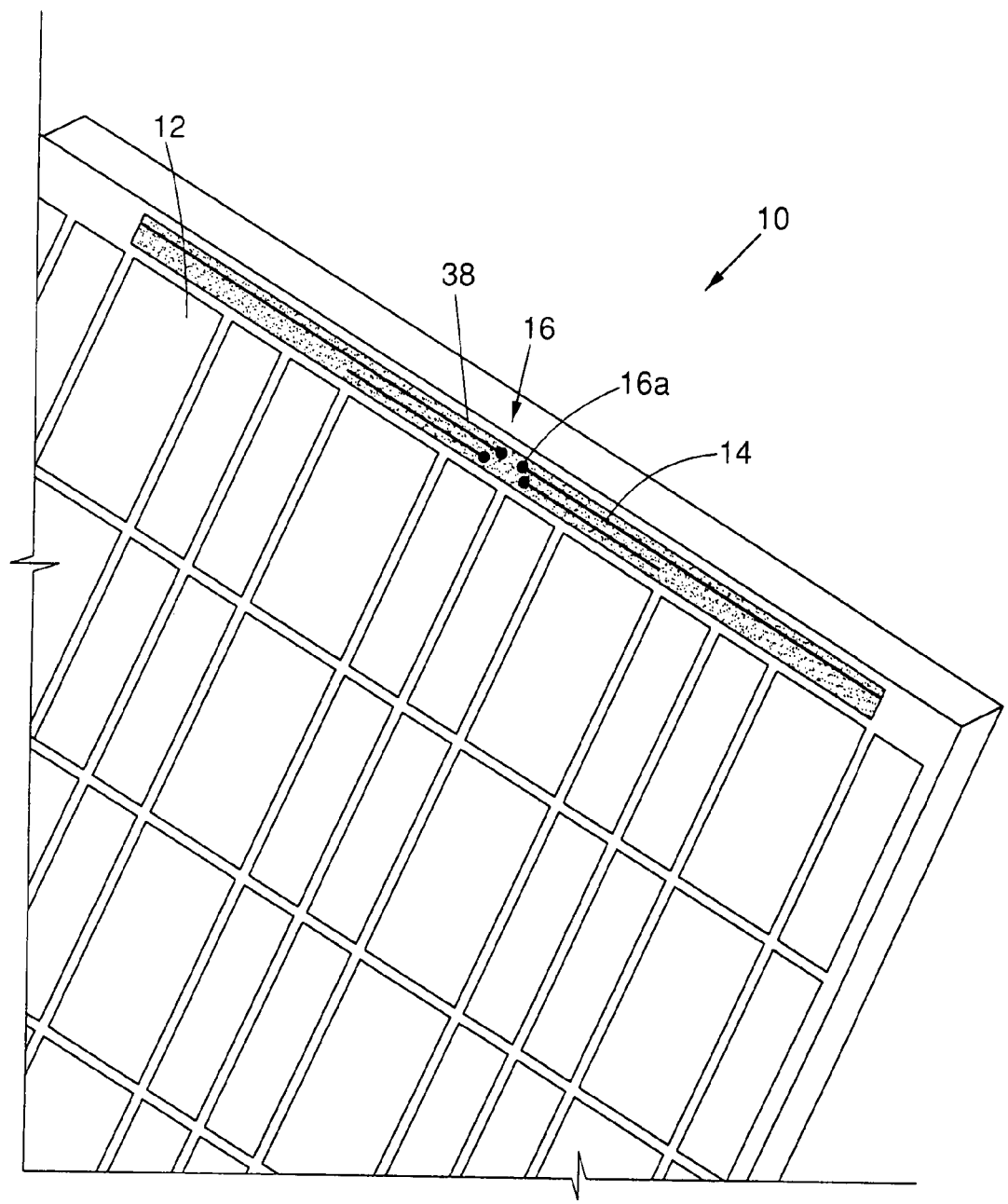
FIG. 1 is a drawing of a portion of a solar panel.
Figure 2:
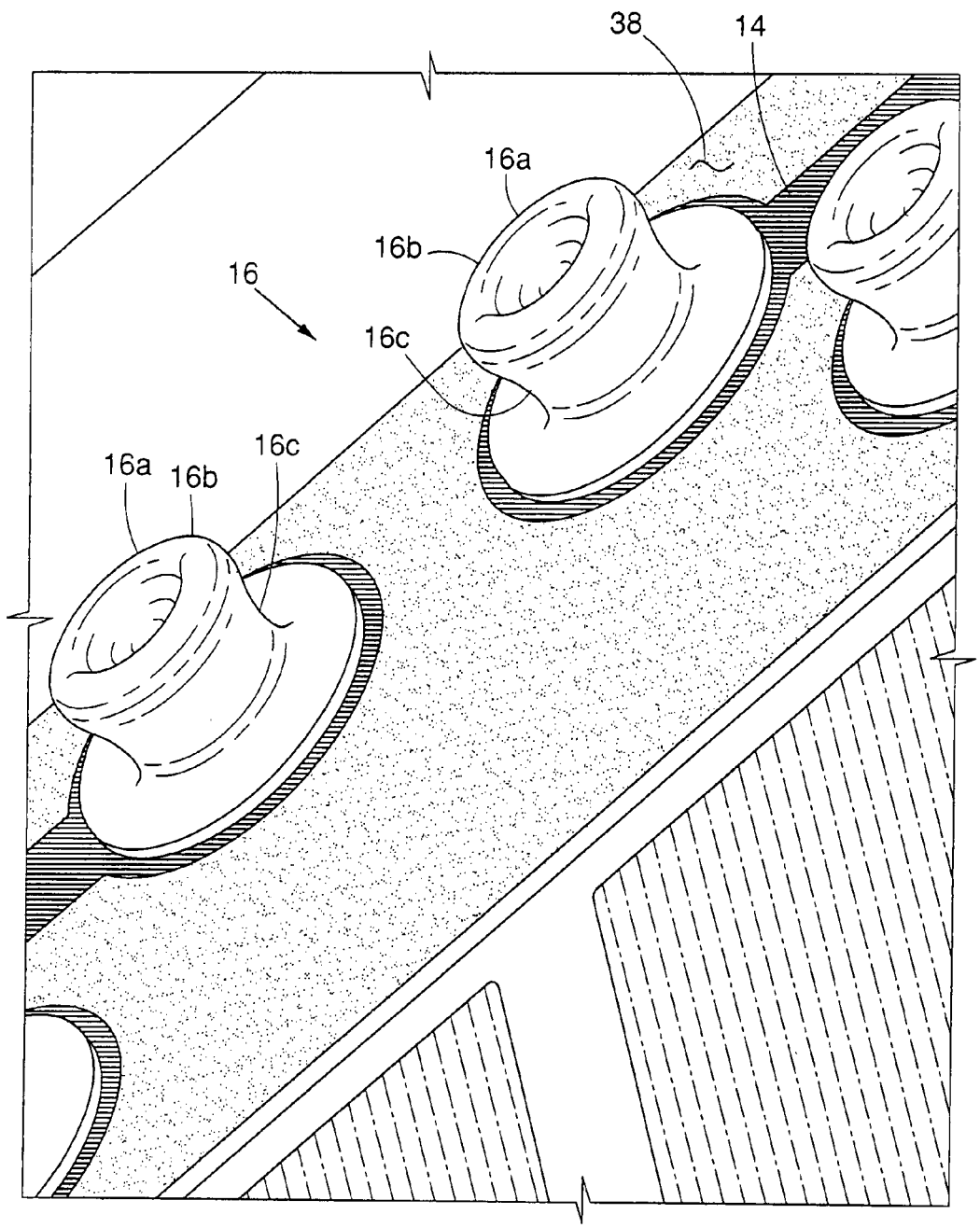
FIG. 2 is a perspective view of an electrical connection region of the solar panel.
Figure 3:
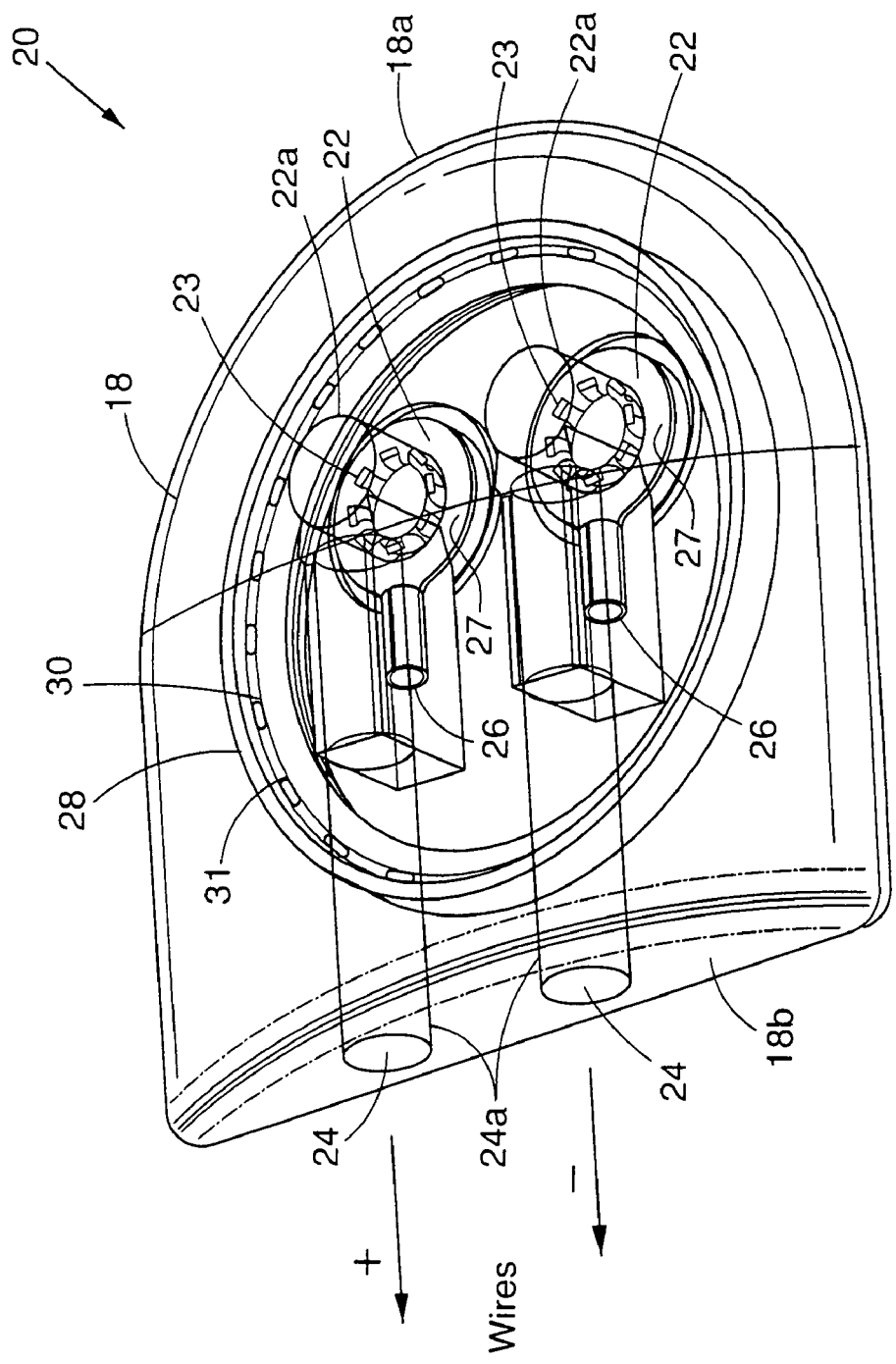
FIGS. 3 and 4 are perspective see through views of an embodiment of an electrical connector assembly.
Figure 4:
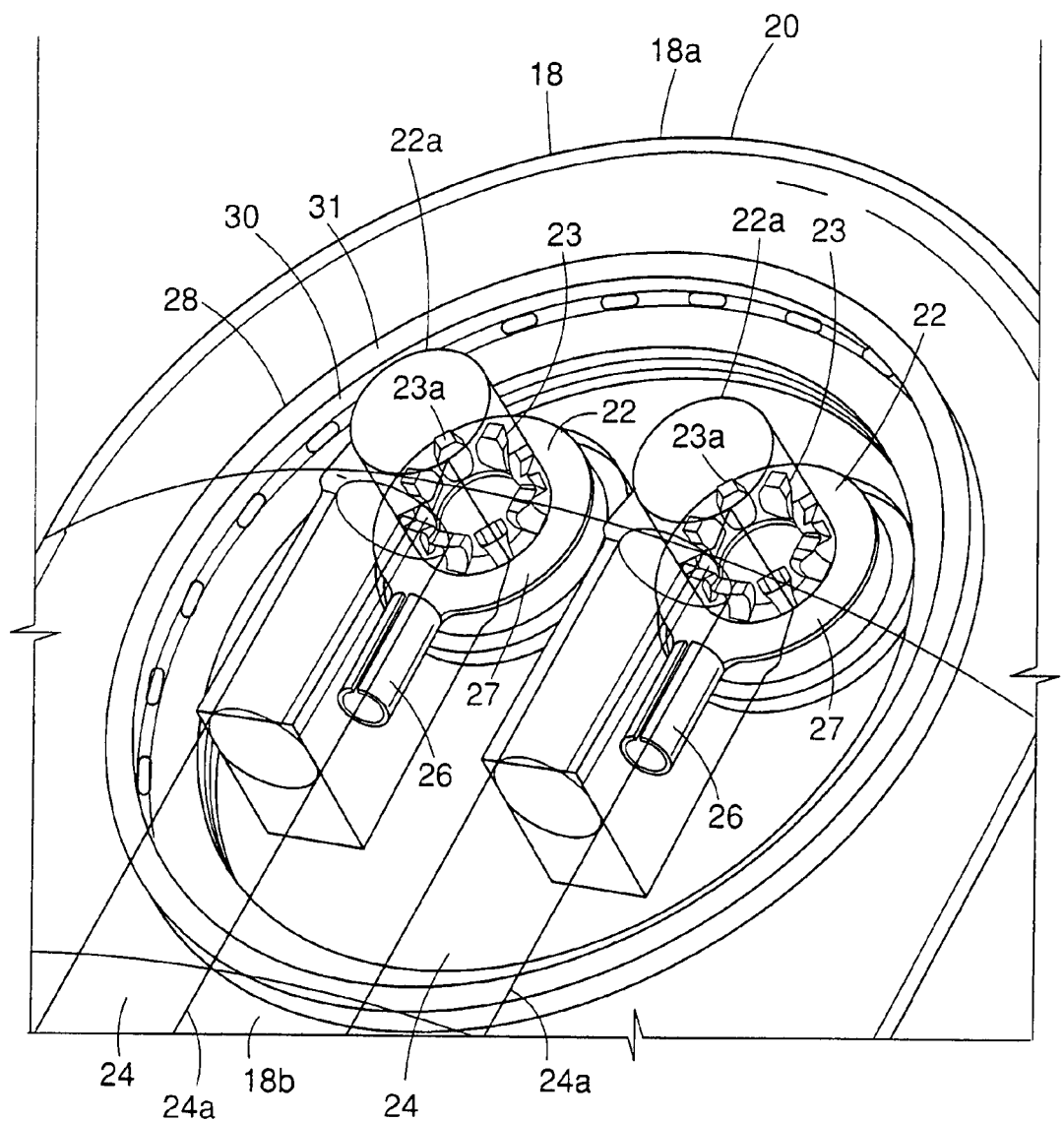

Referring to FIGS. 1 and 2, solar panel 10 has a series of solar cells 12 that are electrically connected to conductors 14. Selected conductors 14 can terminate at, or be electrically connected to electrical terminals 16a which can protrude from a planar mounting surface 38 located at an electrical connection region 16, often at the back of the solar panel 10. There typically can be two or more electrical terminals 16a, with four being shown in FIG. 1 as an example. The electrical terminals 16a can be male circular snap button electrical connector terminals that are soldered or otherwise secured to the conductors 14 and secured to the surface 38 of the electrical connection region 16. The male electrical terminals 16a can be similar to those disclosed in U.S. Pat. No. 7,083,481, the contents of which are incorporated herein by reference in its entirety. Alternatively, other suitable electrical connector terminals can be used. The solar panel 10 can be covered with laminating materials 34 (FIG. 7) which can seal out moisture. The laminating material 34 can include a polymeric material such as ethyl vinyl acetate (EVA), and also can include or be laminated with a backing such as a polyvinyl fluoride (PVF) backing or glass backing 35. The laminating material 34 can be applied in a sheet and turned into melted liquid form during processing under heat and pressure during lamination.

Referring to FIGS. 3-7, electrical junction or connector assembly 20 is one embodiment of an electrical connector assembly which can be employed to allow electrical connections to be easily and quickly made to solar panels 10 on site. The electrical connector assembly 20 can include a connector body 18 with a rounded or circular nose 18a which houses female electrical connectors 27, for example two, having female electrical terminals 22, within respective recesses 22a positioned on an electrical engagement face 21, which can be planar. The recesses 22a can be sized for each female electrical terminal 22, or alternatively, one large recess can be employed for housing both female electrical terminals 22. The female electrical terminals 22 can have resilient female circular connector sockets 23 with a circular pattern of resilient contact tabs 23a (FIG. 11), for engaging the male electrical terminals 16a (FIG. 6), for example two, for electrical connection therebetween. The electrical connectors 27 can be similar to those disclosed in U.S. Pat. No. 6,520,812, the contents of which are incorporated herein by reference in its entirety. The electrical connectors 27 can have securement portions 26, such as a crimping region with crimping tabs for electrical connection to respective electrical cables, wires or conductors 24. The electrical cables 24 can extend from the rear 18b of the body 18 for electrical connection to desired locations and components. The electrical cables 24 can electrically connect the solar panel 10 to other solar panels to create an array, which can be in series or in parallel.

Figure 5:
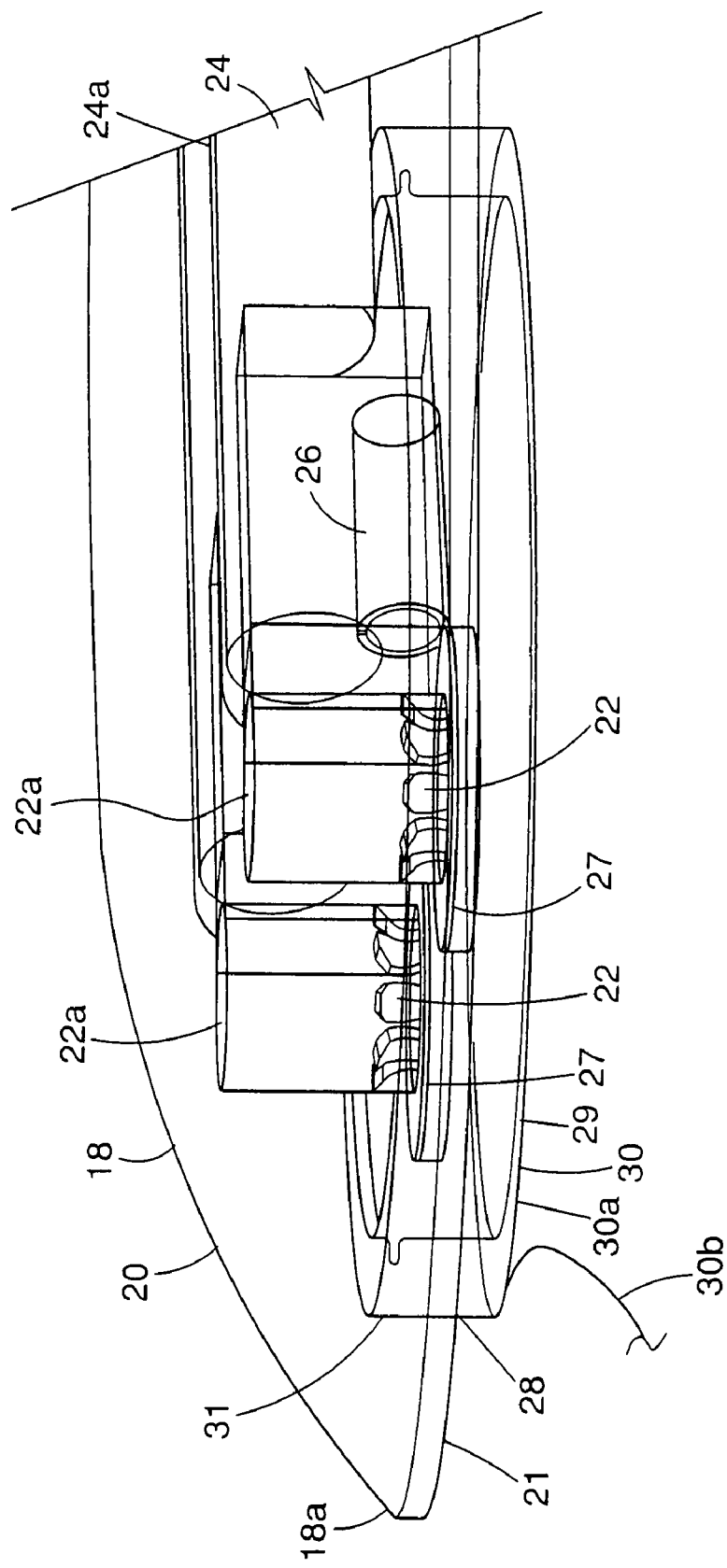
FIG. 5 is a side see through view of a portion of the electrical connector assembly of FIGS. 3 and 4.
Figure 6:
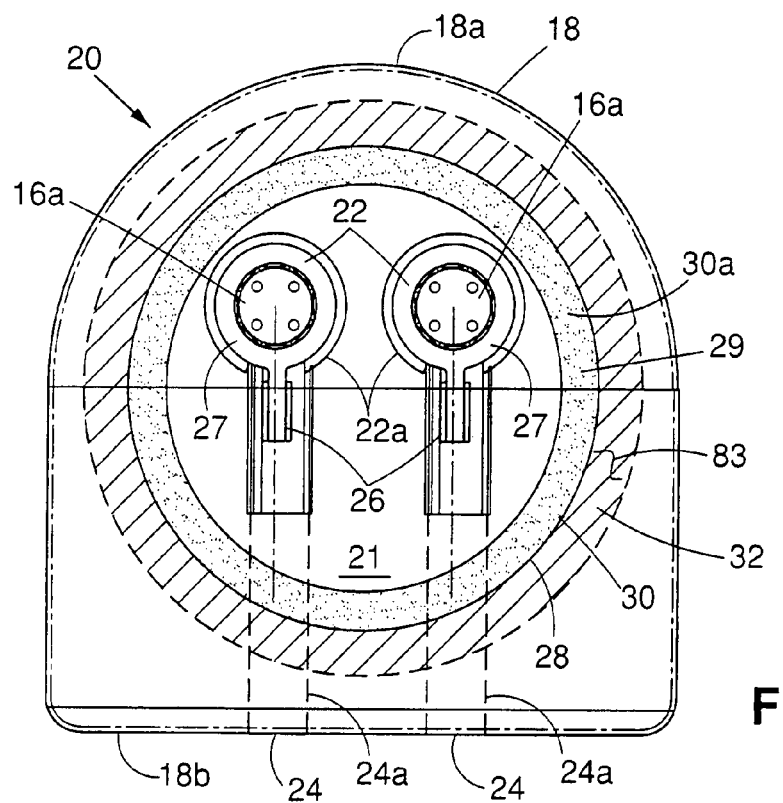
FIG. 6 is a bottom view of the electrical connector assembly of FIGS. 3 and 4.

The electrical connector assembly 20 can include a mounting, securement, or housing member 30 such as a ring. The ring 30 can be circular or tubular in shape, and have a wall surrounding an interior region or cavity 36, a sealing surface 29 at one axial end, and a securement rim 31 at the opposite axial end. The securement rim 31 can be mechanically engageable or lockable in a sealed manner with engagement surfaces such as a circular recess or annular groove 28 on the bottom of the body 18. The sealing surface 29 of the ring 30 can be adhered to the surface 38 of the solar panel 10 at the electrical connection region 16 around the male electrical terminals 16a. The ring 30 can be adhered before the laminating material 34 is applied. The ring 30 can include an adhesive layer 30a, for example double sided adhesive tape, or an adhesive layer covered by release paper 30b (FIG. 5). The release paper 30b can be removed to allow the ring 30 to be adhered to the surface 38 around the electrical terminals 16a. Alternatively, the ring 30 can be adhered by an adhesive or sealant applied at the time the ring 30 is adhered. The laminating material 34 can then be applied and turned into liquid form over the solar panel 10. The sealing surface 29 at the bottom of the ring 30 with the adhesive layer 30a can seal against surface 38 which can block or prevent the entry or intrusion of the laminating material 34 into the electrical connection region 16. The electrical terminals 16a can be secured to the surface 38 before the ring 30 and laminating material 34 is applied, or alternatively, can be secured later. The ring 30 can have a height greater than the height of the laminating material 34, and can provide a barrier or dam for the laminating material 34 so that the electrical connection region 16 does not become covered with laminating material 34, thereby allowing access to the male electrical terminals 16a for electrical connection. The height of the ring 30 can depend upon the thickness of the laminating material 34 and backing 35, and can protrude above the laminating material 34 and backing 35 for securement to the connector body 18. The male electrical terminals 16a can have a height that is less than the ring 30 and of the laminating material 34. Consequently, the ring 30 can allow access to the male electrical terminals 16a within cavity 36.

When the laminating material 34 has hardened, forming a hole 33 and sealing to and around the ring 30, the body 18 of the electrical connector assembly can be engaged with the ring 30 by engaging securing, locking or snapping the groove 28 over the engagement rim 31 of the ring 30 and extending the female electrical terminals 22 into the interior region 36 of the ring 30 and into engagement with the protruding male electrical terminals 16a at the bottom of the hole 33. Alternatively, the laminating material 34 and backing 35 can be first applied to the solar panel 10, and a hole 33 can be later cut to expose the electrical connection region 16. The ring 30 can then be positioned, secured, and sealed within the hole 33 to the laminating material for engagement with the body 18.

Figure 7:
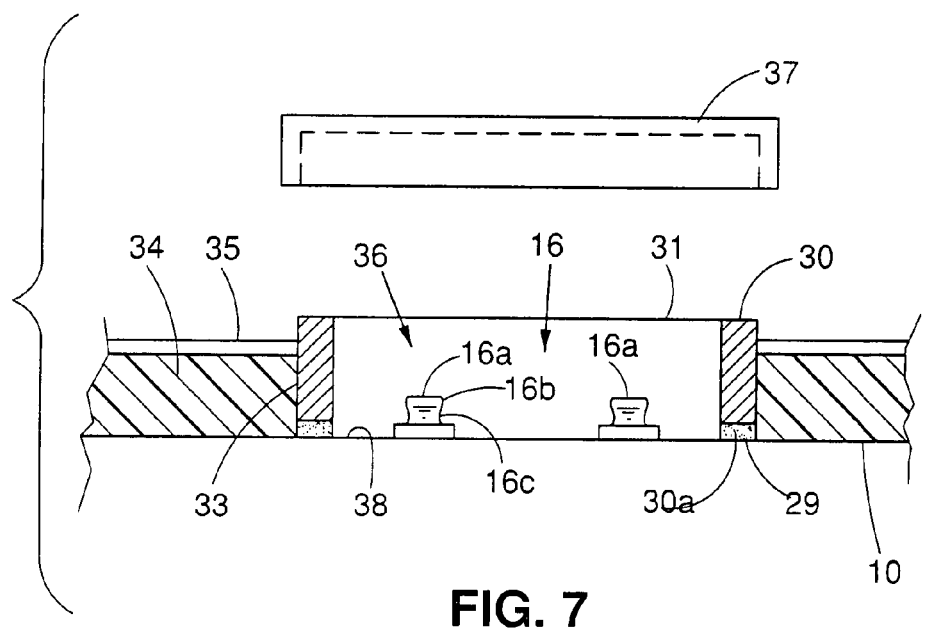
FIG. 7 is a side view of a housing member ring extending around an electrical connection region and surrounded by laminating material.
Figure 8:
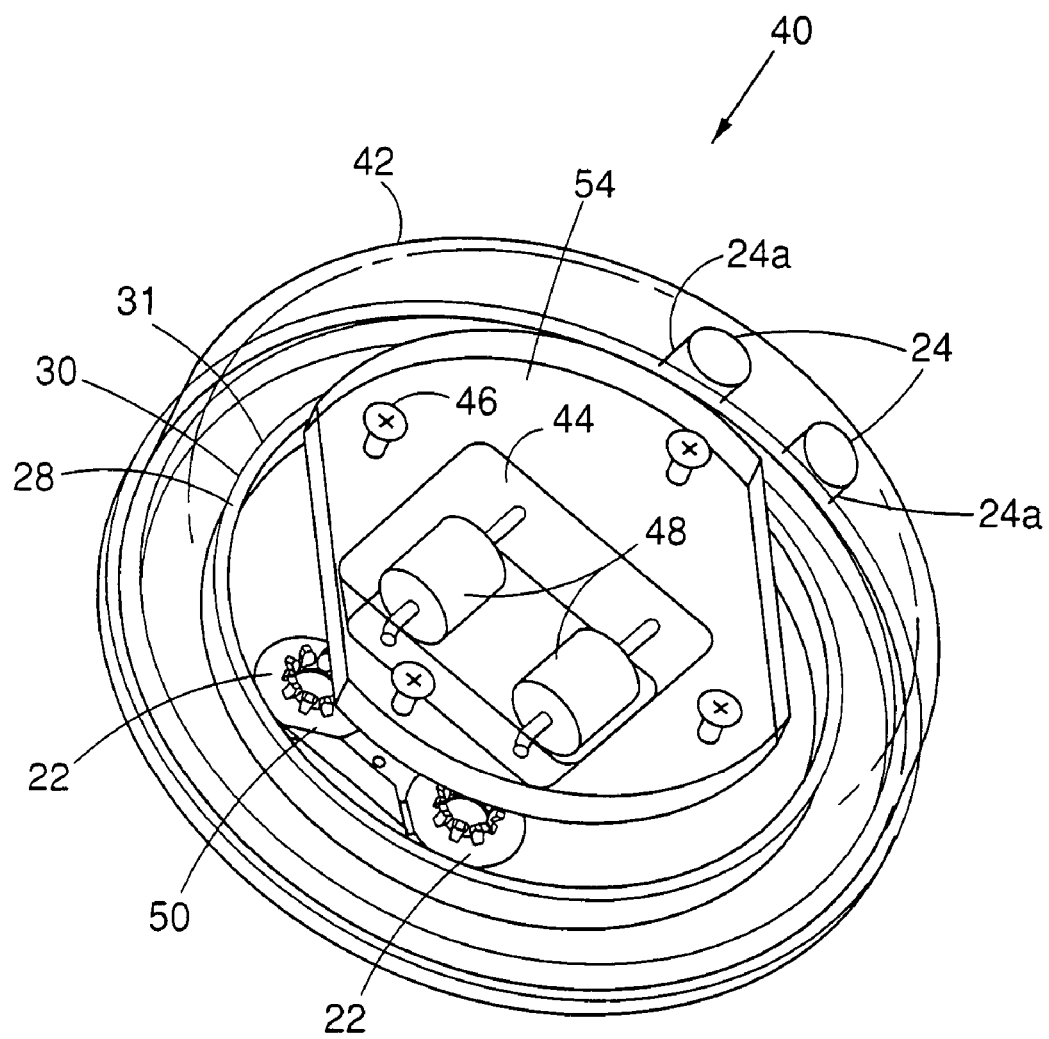
FIG. 8 is a top perspective see through view of another embodiment of an electrical connector assembly.
Figure 9:
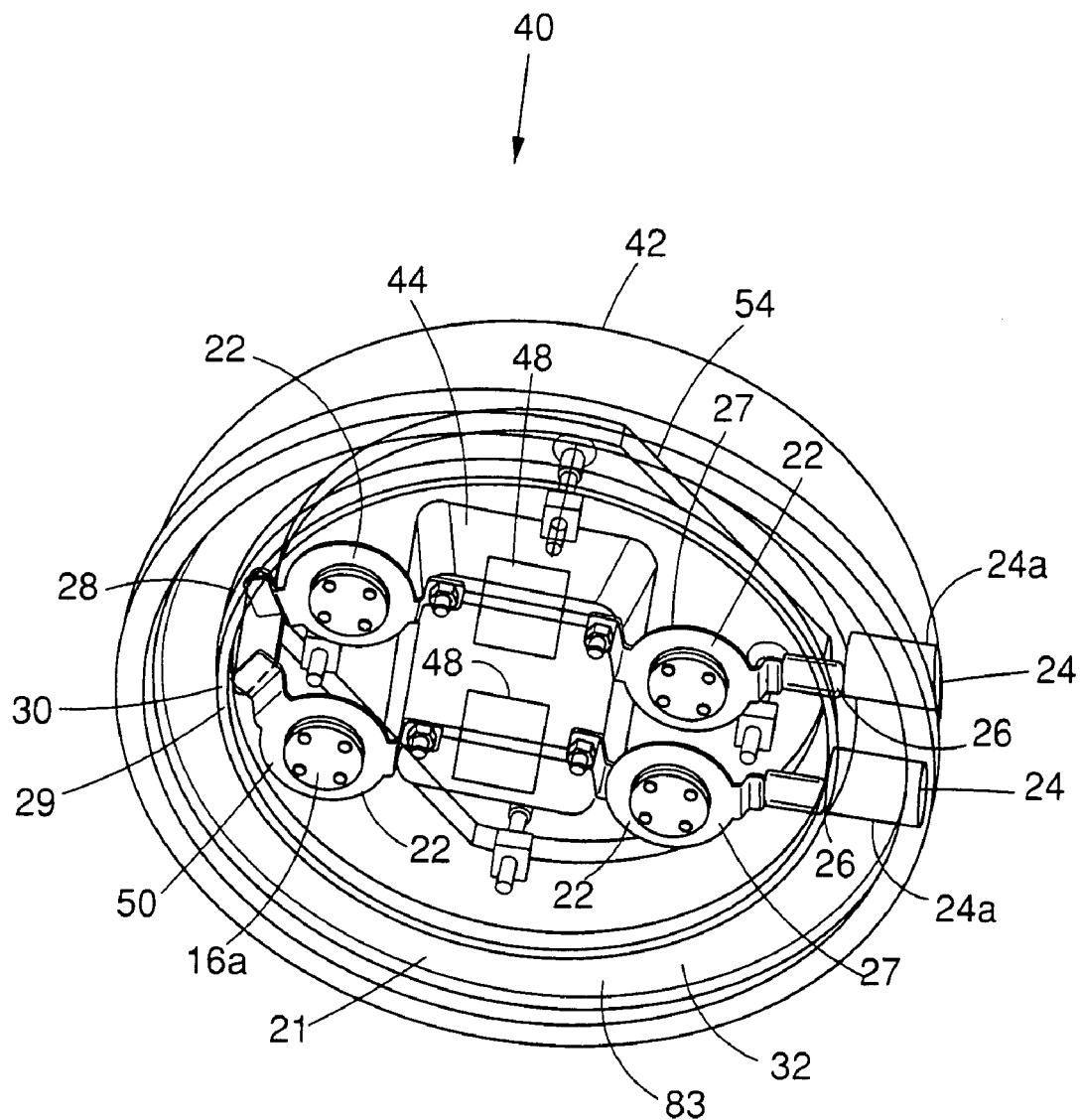
FIG. 9 is bottom perspective see through view of the electrical connector assembly of FIG. 8.

The engagement rim 31 of the ring 30 and the groove 28 can be configured to have locking and/or water sealing features. Additionally, sealant material, for example silicone, can be added to increase the sealing capabilities. The bottom of the body 18 on the electrical engagement face 21 can include an adhesive layer 32 surrounding the groove 28 for adhering the body 18 to the laminating material 34 or backing 35 (FIG. 7). This can provide additional securement and sealing capabilities, including a planar sealing surface 83, on the electrical engagement face 21 surrounding the female circular connector sockets 23 of the female electrical terminals 22 for sealing out moisture. Sealant material can also be added between the body 18 and the laminating material 34 or backing 35. If the ring 30 is applied to the surface 38 after the male electrical terminals 16a are in place, a locating fixture or jig can be used to locate the ring 30 into the proper position relative to the male electrical terminals 16a. Alternately, if the male electrical terminals 16a are secured or soldered to surface 38 after the ring 30 is secured in place, a locating fixture or jig can be used to solder the male electrical terminals 16a in the proper position relative to each other and the ring 30. The male electrical terminals 16a can protrude from the surface 38 of the electrical connection region 16 into the interior region 36 of the ring 30. In some embodiments, the groove 28 in body 18 can be replaced with a cavity in which the diameter of the cavity engages or snaps onto the ring 30. The body 18 and the ring 30 can be made of insulative material such as polymers, plastics or ceramics. The body 18 can have openings 24a to allow the passage of the electrical cables 24, or which alternatively, can be formed by molding the body 18 over the electrical cables 24.

Consequently, the solar panels 10 can be shipped with the electrical connection region 16 having the configuration shown in FIG. 7 so that electrical connections between solar panels 10 can be made by engaging or snapping the bodies 18 of the electrical connector assemblies 20 in place onto the rings 30, whereby the sockets 23 of the female electrical terminals 22 on electrical engagement face 21 extend into the cavity 36 of ring 30 and also engage the male electrical terminals 16a which are located below the laminating material 34 in the cavity 36 surrounded by ring 30. At the same time, the hole 33 and cavity 36 surrounding the male electrical terminals 16a can be sealed in a watertight manner. The male electrical terminals 16a can have heads 16b which are wider than the lower portions 16c for locking the female terminals 22 to the male electrical terminals 16a. This can reduce the possibility of unwanted disengagement, for example by heat related expansion and contraction. As a result, the electrical connector assembly 20 and connector body 18 can be quickly and easily secured with both electrical and mechanical engagement in a sealed or watertight manner for electrically connecting solar panels 10 together. The solar panels 10 can be shipped with a protective removable cover 37 (FIG. 7) which can engage the ring 30 and cover the electrical connection region 16.

Figure 10:
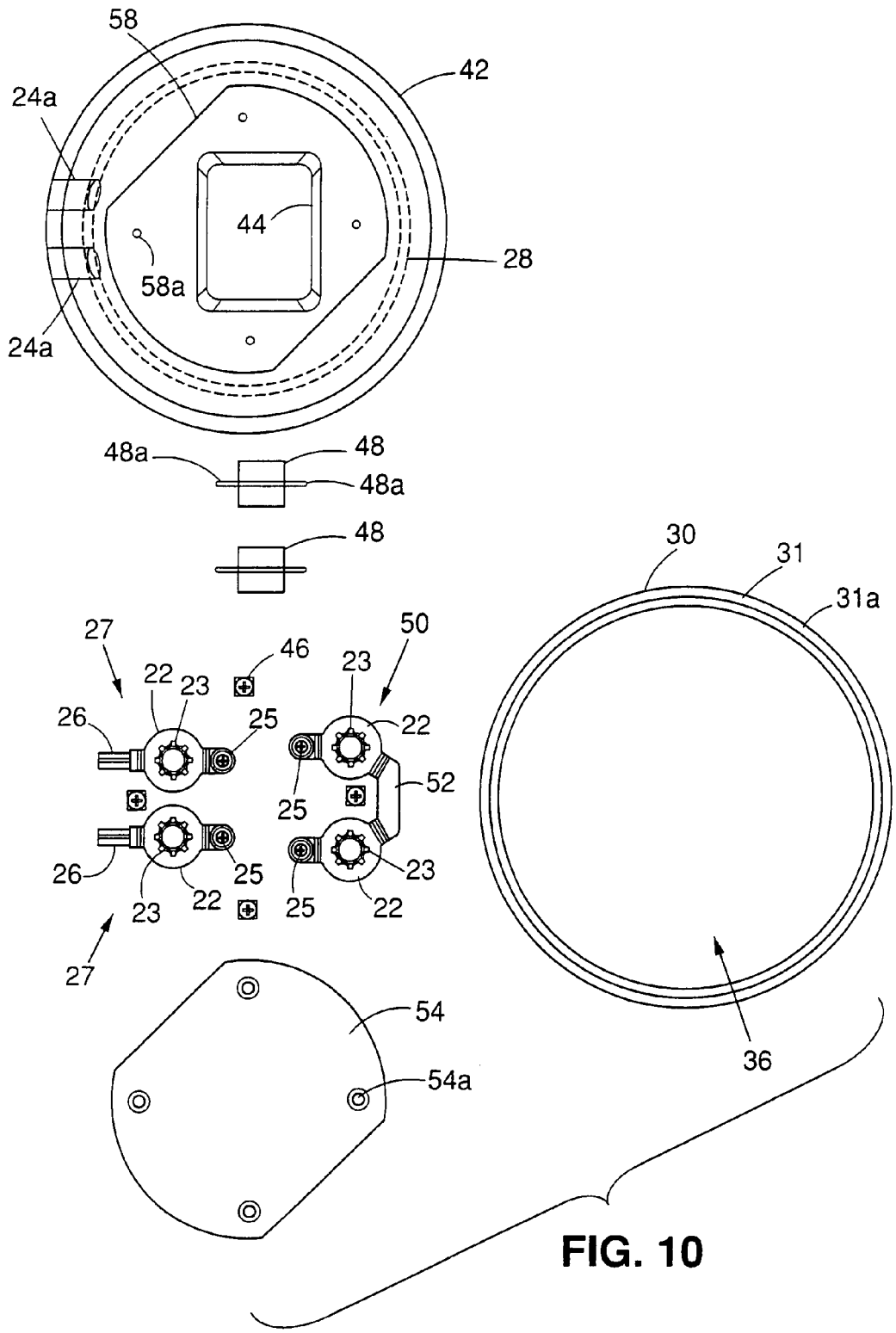
FIG. 10 is an exploded view of the electrical connector assembly of FIG. 8.
Figure 11:
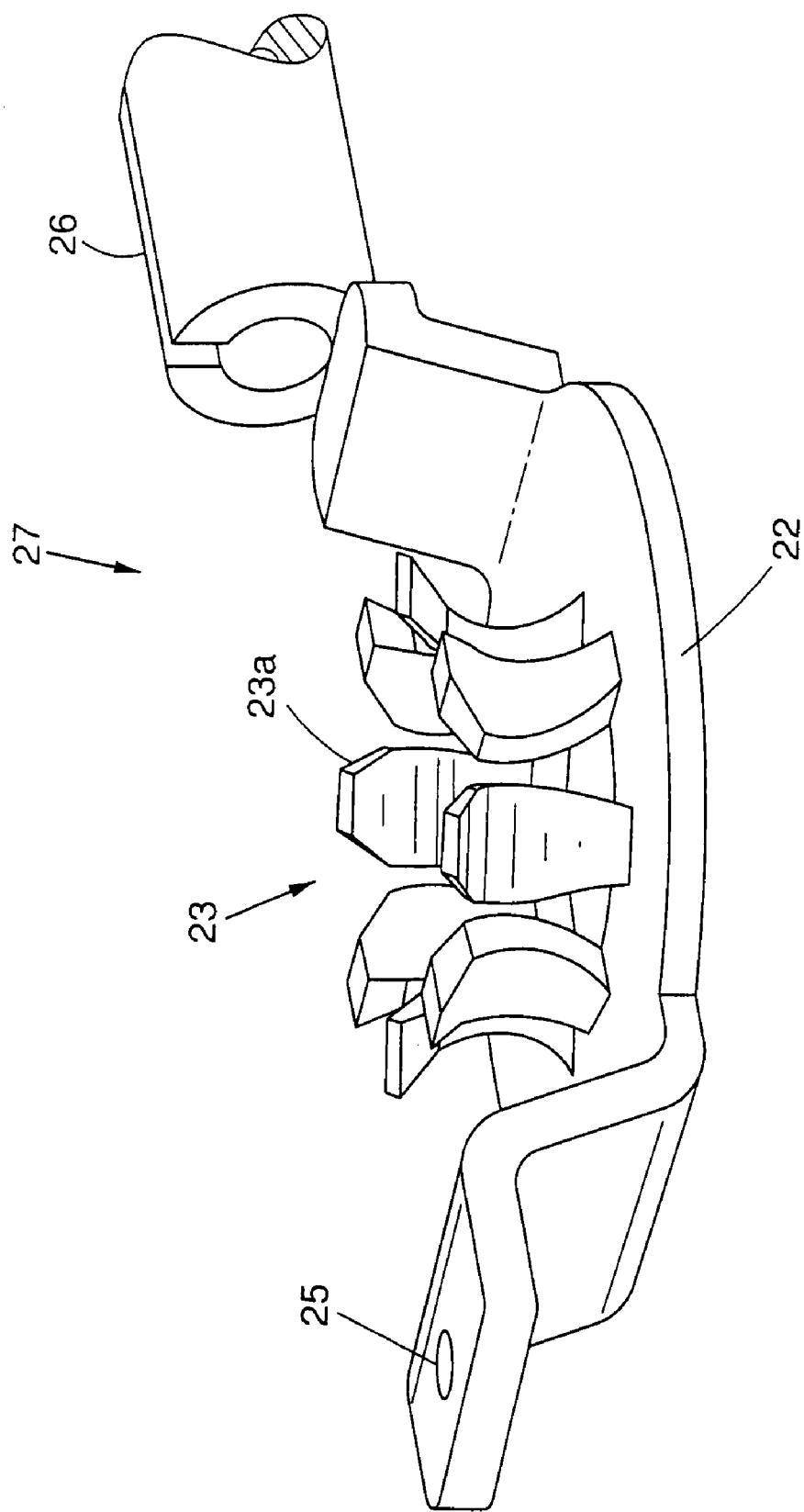
FIG. 11 is a perspective view of a portion of an embodiment of a female electrical connector.
Figure 12:
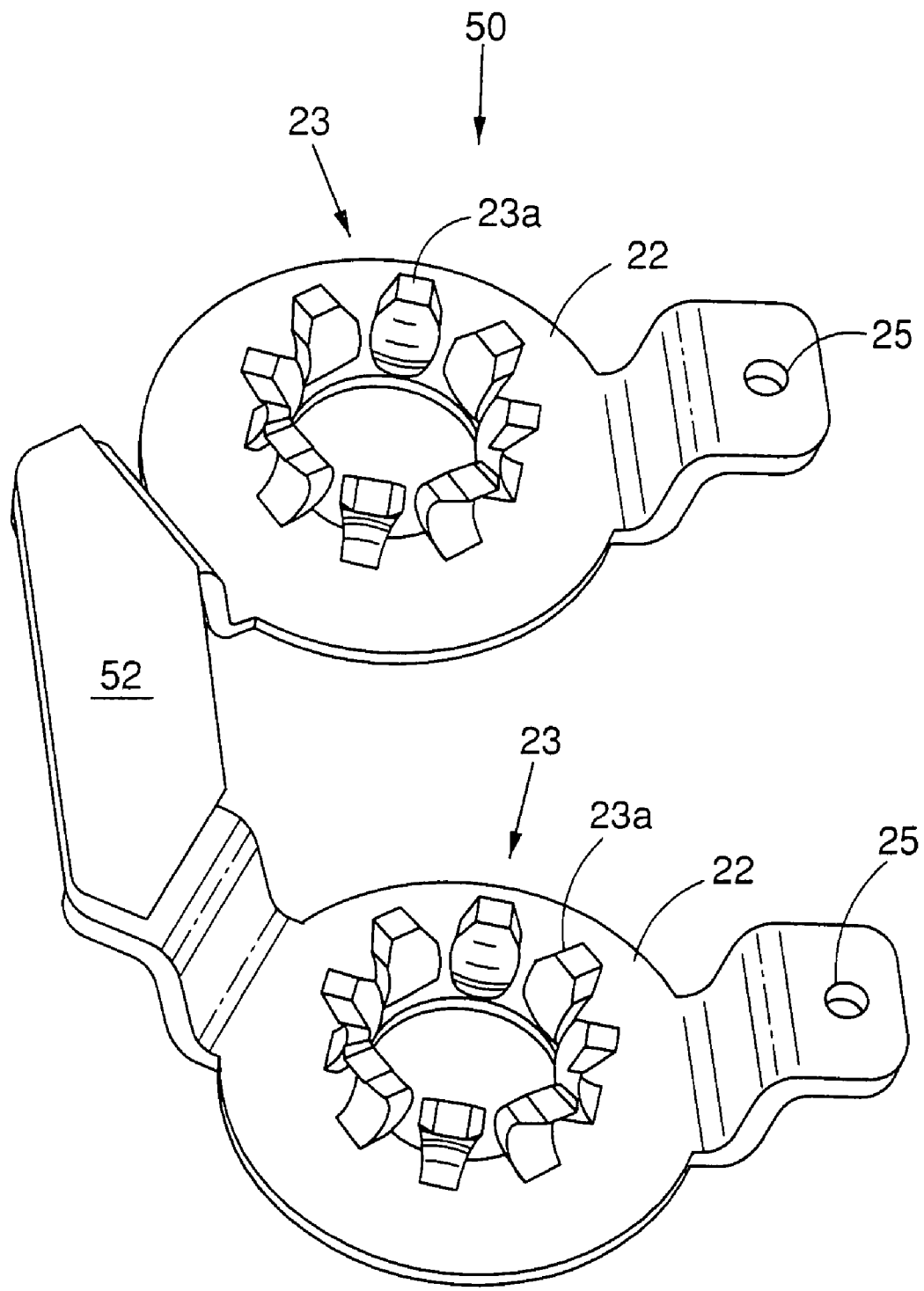
FIG. 12 is a perspective view of another embodiment of a female electrical connector.

FIGS. 8-12 depict another embodiment of an electrical junction or connector assembly 40 which can have a body 42 with a circular shape. The electrical connector assembly 40 differs from electrical connector assembly 20 in that a removable access cover 54 can be secured to the top of the body 42 within a recess 58 by screws 46 within holes 54a and 58a. The cover 54 and recess 58 can be shaped to have a close fit and can include a gasket for sealing purposes. The access cover 54 can provide access to the inner components and circuitry of the electrical connector assembly 40. The engagement rim 31 of the ring 30 can have an annular shoulder 31a for sealing and/or locking purposes. The electrical connector assembly 40 can have at least four female electrical terminals 22 within recesses 22a on electrical engagement face 21 for mating with corresponding at least four male electrical terminals 16a on the solar panel 10. The four electrical terminals 22 can be provided on two single female electrical connectors 27 and on a dual female electrical connector 50 (FIGS. 10-12). The two female electrical connectors 27 can be electrically connected to cables 24 at the securement portions 26. The opposite end of each female electrical connector 27 can include a connection portion 25 which can be electrically connected to a lead 48a at one end of a diode 48. The leads 48a at the opposite end of each diode 48 can be electrically connected to the connection portions 25 on the dual electrical connector 50. The leads 48a can be secured to the connection portions 25 by screws 46. Washers can be employed if necessary. The diodes 48 can be positioned within a recess 44 within the body 42. The diodes 48 can be accessed by removing the cover 54, allowing replacement of the diodes as well as other components when necessary. The dual electrical connector 50 can have a jumper 52 electrically connecting the two female electrical terminals 22 together, which can be stamped from the same material as the electrical terminals 22. Alternatively, the electrical terminals 22 can be separate components that are then connected together to function as the dual electrical connector 50.

The electrical connector assembly 40 can be secured and connected to solar panel 10 in a similar manner as previously described. The electrical conductors 14 and four male terminals 16a can be appropriately electrically configured on the solar panel 10, and the female electrical terminals and electrical circuit of connector assembly 40 can be electrically connected or arranged, to provide electrical bypass circuitry. As a result, when the solar panel 10 is shaded, or when solar cells 12 are damaged, the diodes 48 can direct electricity away from the solar panel 10 so that non productive solar panels 10 do not draw power away from other productive solar panels 10. In some embodiments, the connectors 27 and 50 can be positioned within a single cavity which also engages ring 30. In addition, the electrical connectors 27 and 50 can be crimped, or soldered to the leads of the diodes 48.

Figure 13:
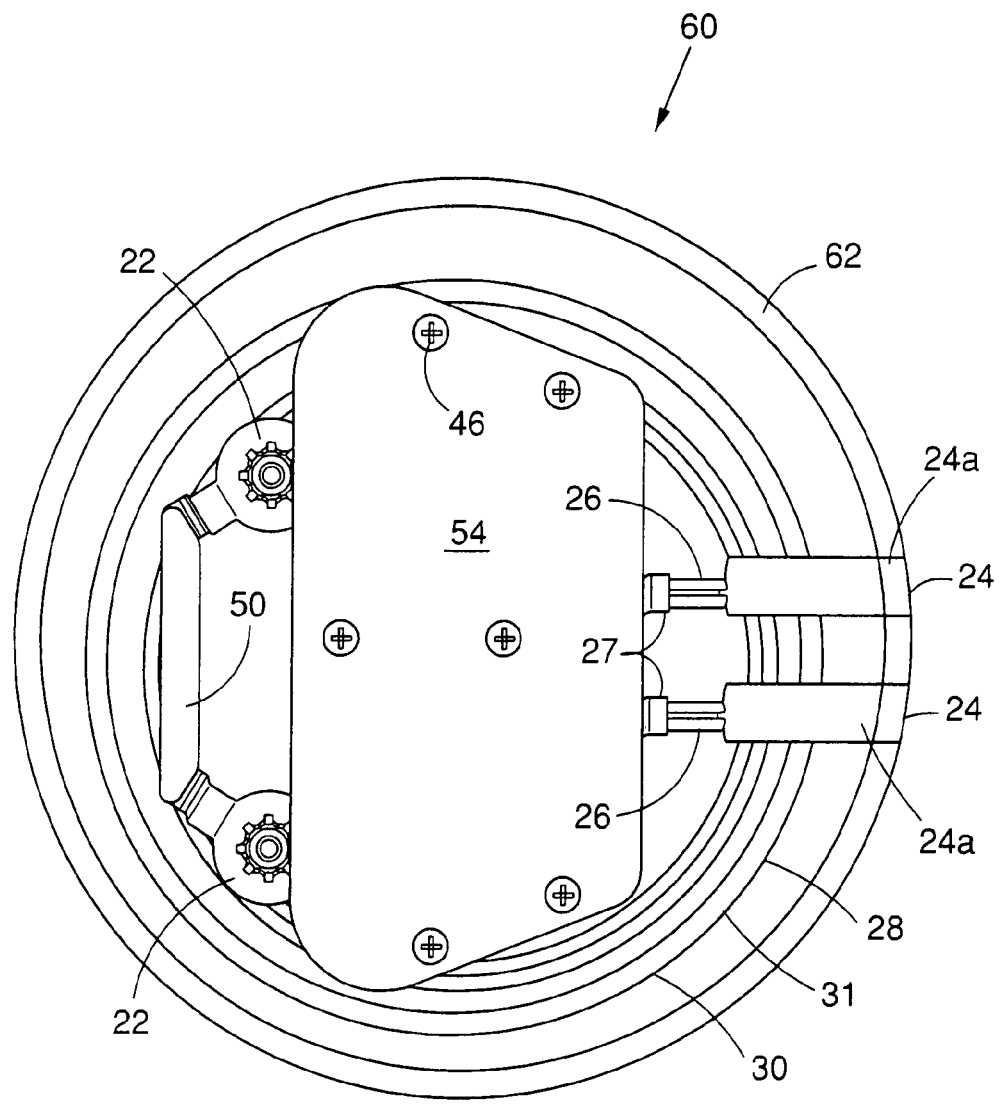
FIG. 13 is a top see through view of another embodiment of an electrical connector assembly.
Figure 14:
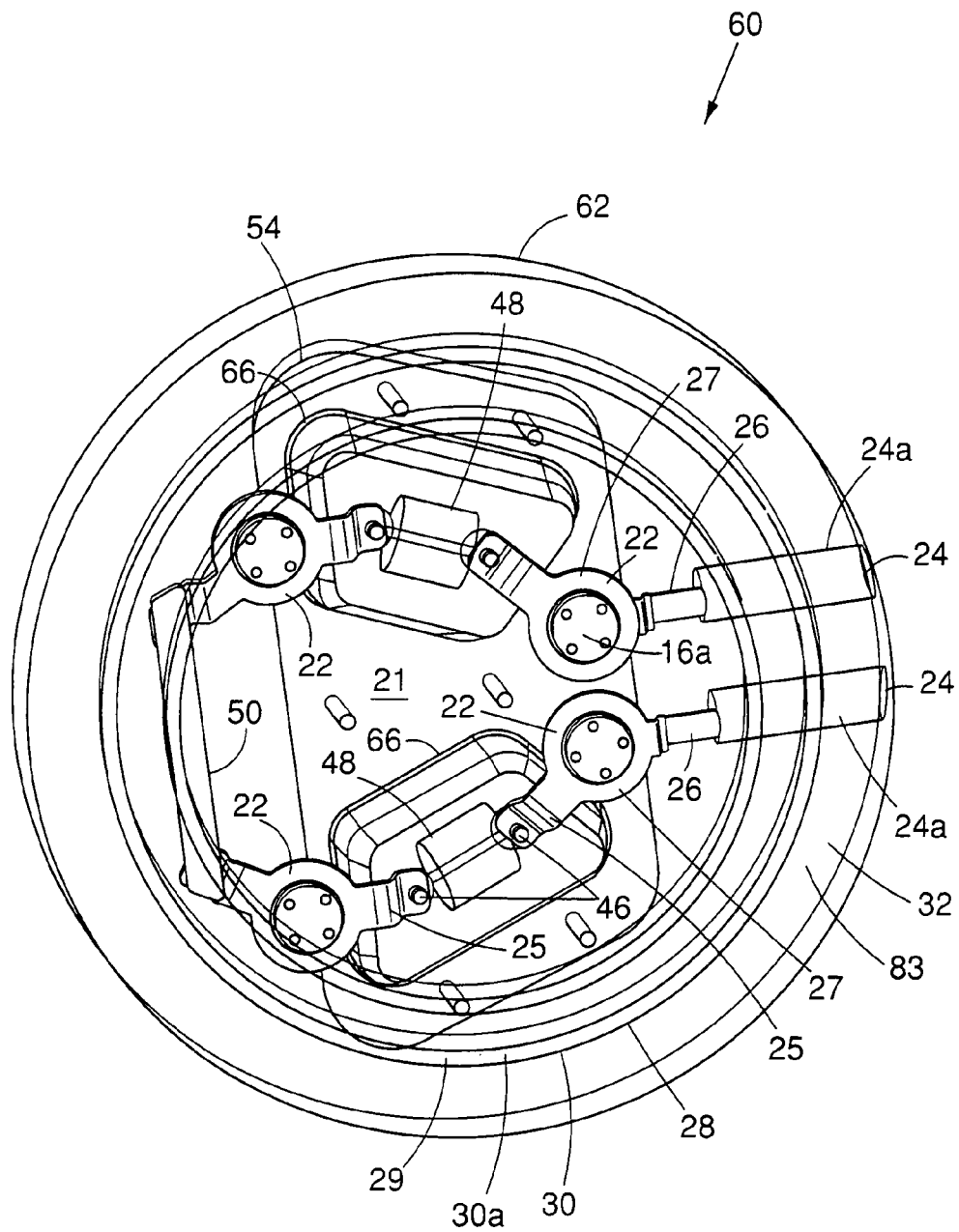
FIG. 14 is a bottom see through view of the electrical connector assembly of FIG. 13.
Figure 15:
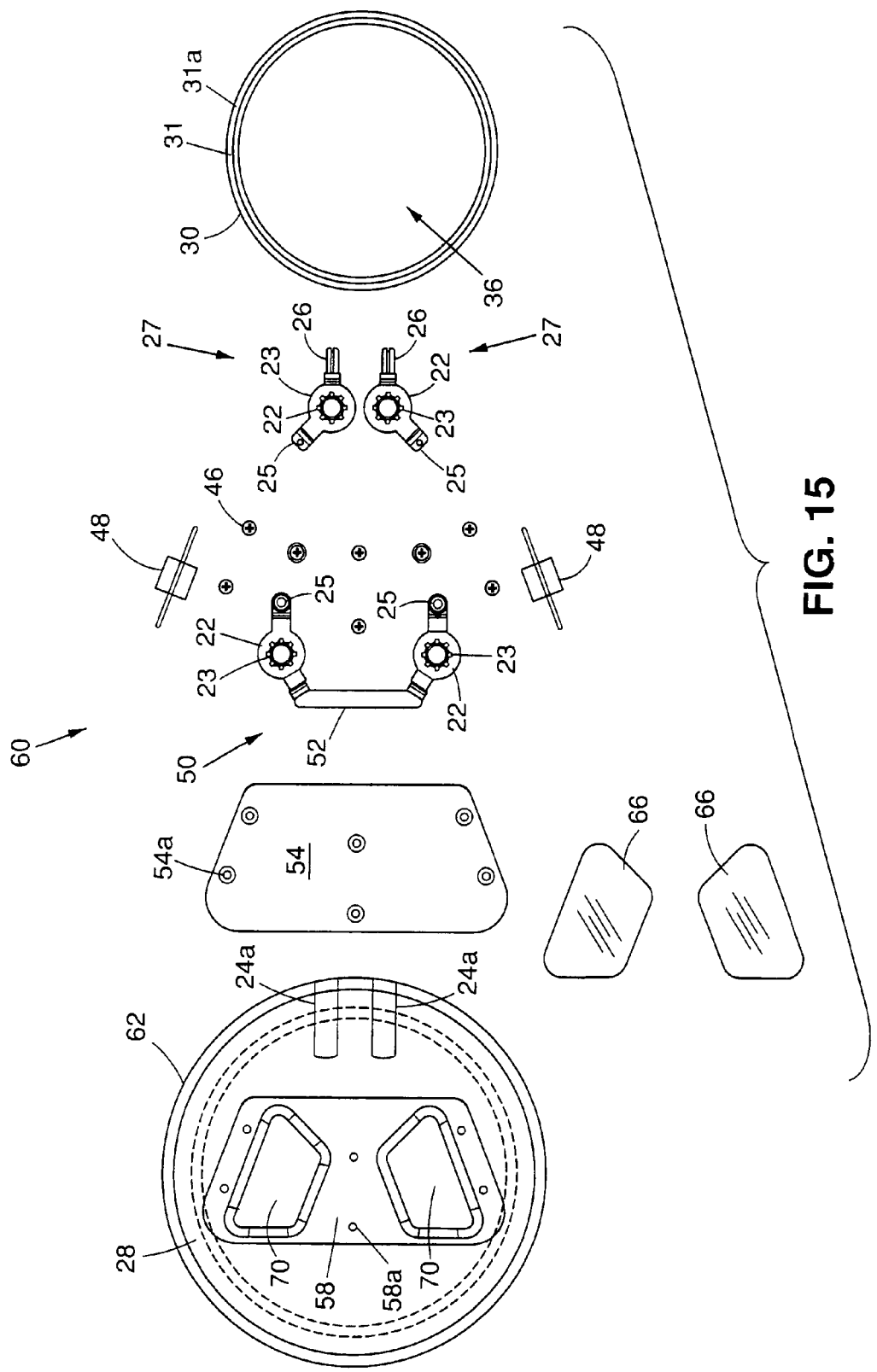
FIG. 15 is an exploded view of the electrical connector assembly of FIG. 13.
Figure 16:
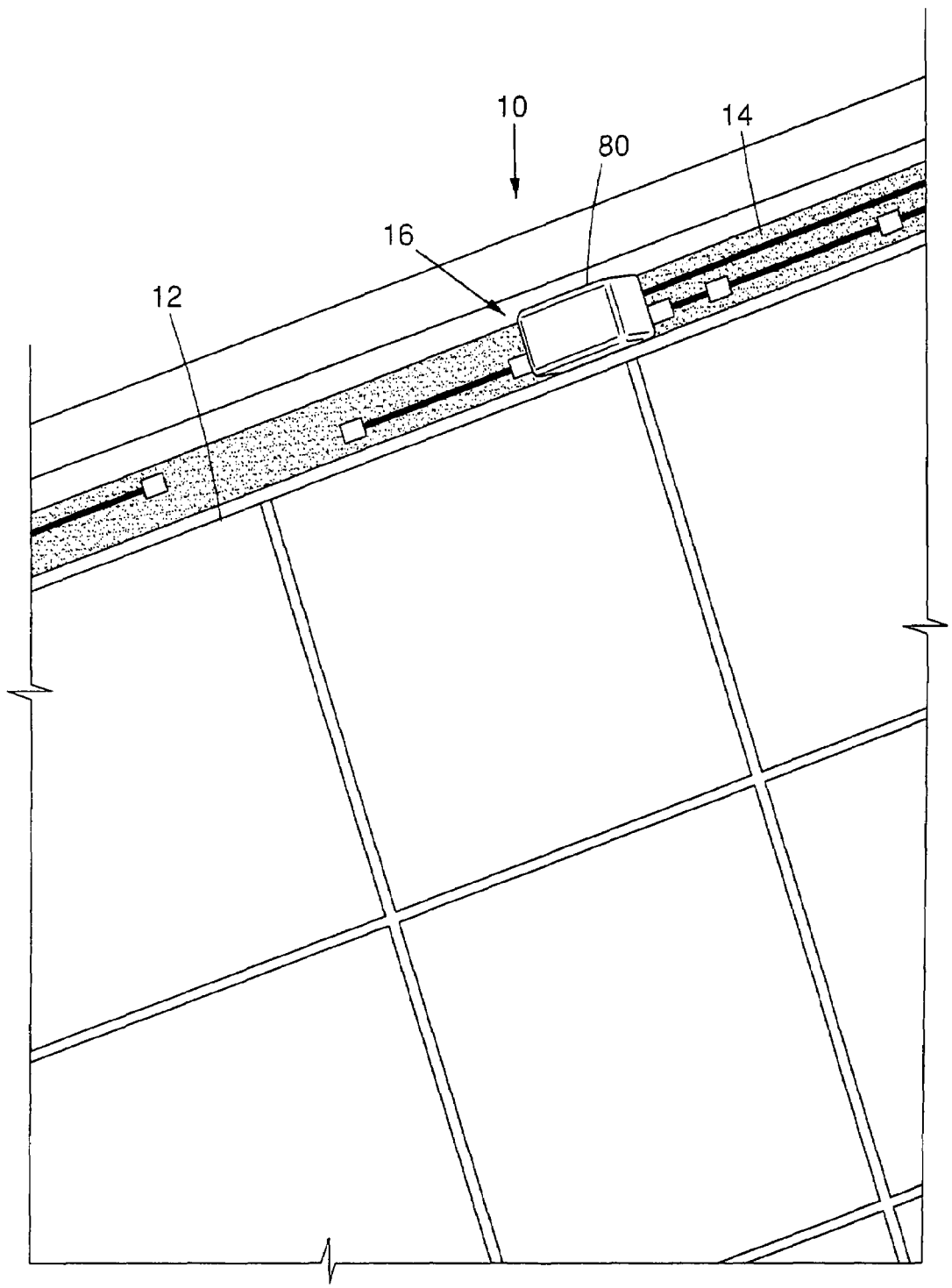
FIG. 16 is a perspective view of a portion of a solar panel with yet another embodiment of an electrical connector assembly.
Figure 17:
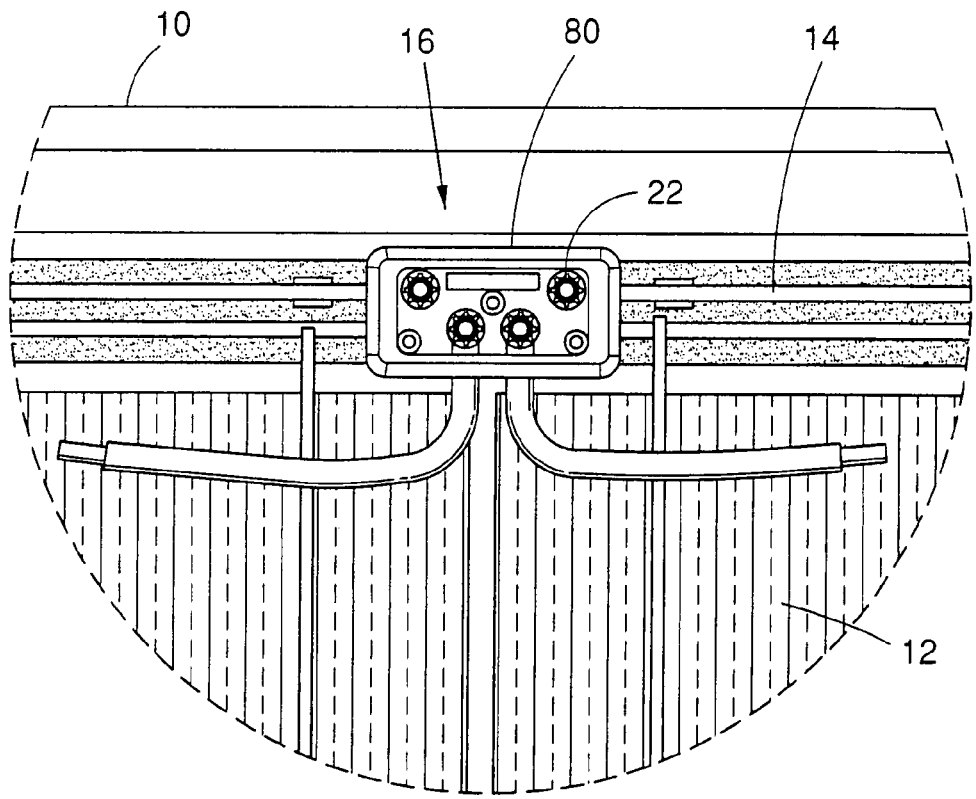
FIG. 17 is a plan view of the electrical connector assembly of FIG. 16 on a solar panel with the top removed.

FIGS. 13-15 depict another embodiment of an electrical junction or connector assembly 60 which differs from electrical connector assembly 40 in that electrical connector assembly 60 can include two recesses 70, one for each diode 48, which can be sealed by rubber gaskets 66. The dual electrical connector 50 can have a longer jumper 52 for accommodating the positioning of the diodes 48, and the electrical connectors 27 can have connection portions 25 which are positioned or angled to one side, for alignment purposes. The cover 54 can be shaped appropriately to cover the two recesses 70. Electrical connector assembly 60 can be mounted to solar panel 10 in a manner similar to that described above.

Referring to FIGS. 16-22 electrical junction or connector assembly 80 can include female electrical terminals 22 which are molded into a body 82 and are positioned within or along an electrical engagement face 21, which can be planar. Some embodiments have two or three female electrical terminals 22, and others have four as shown. A planar sealing surface 83 can be on the electrical engagement face 21 and can surround the female electrical terminals 22 for engaging surface 38 and sealing around the female electrical terminals 22. The body 82 can have a rectangular outer perimeter and a generally flat upper surface. The electrical terminals 22 can be provided on electrical connectors 27 and 50 which are electrically connected to electrical cables 24. The electrical cables 24 can extend from the body 82 and can be molded in the body 82. Diodes 48 can be electrically connected to the female electrical terminals 22 in a manner similar to that described above and in a circuit that can provide bypass circuitry. Access to the diodes 48, circuitry, and other components can be provided by a cover 84 which can be removably secured to the body 82 by screws 46 or other suitable means for maintenance and replacement of components. The female circular connector sockets 23 on the electrical engagement face 21 of the electrical connector assembly 80 can be engaged onto the mating male electrical terminals 16a at the electrical connection region 16 of the solar panel 10. An adhesive layer 32 can be included (FIG. 20) on the electrical engagement face 21 on the sealing surface 83 around the female circular connector sockets 23 of the female electrical terminals 22 for securing the electrical engagement face 21 to surface 38 and to provide sealing around the sockets 23 and the electrical terminals 16a for sealing out moisture.

Figure 18:
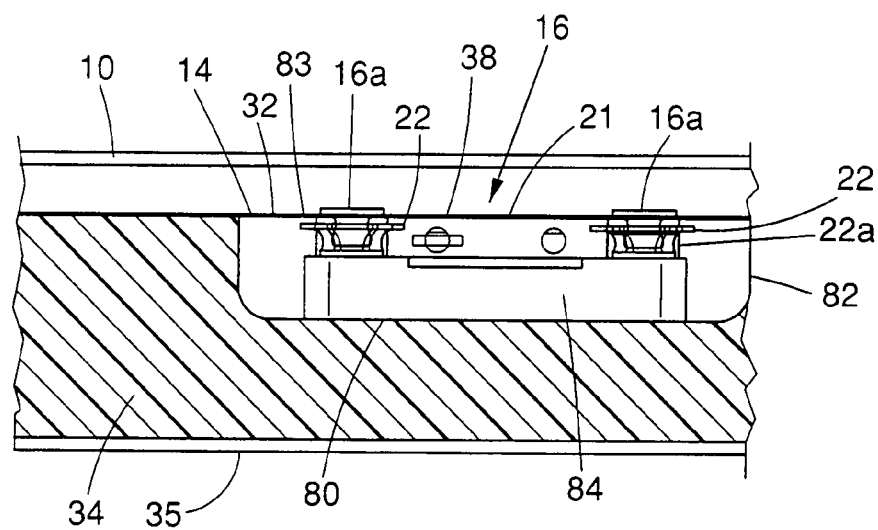
FIG. 18 is a sectional view through a laminated solar panel showing the electrical connector assembly of FIG. 16.
Figure 19:
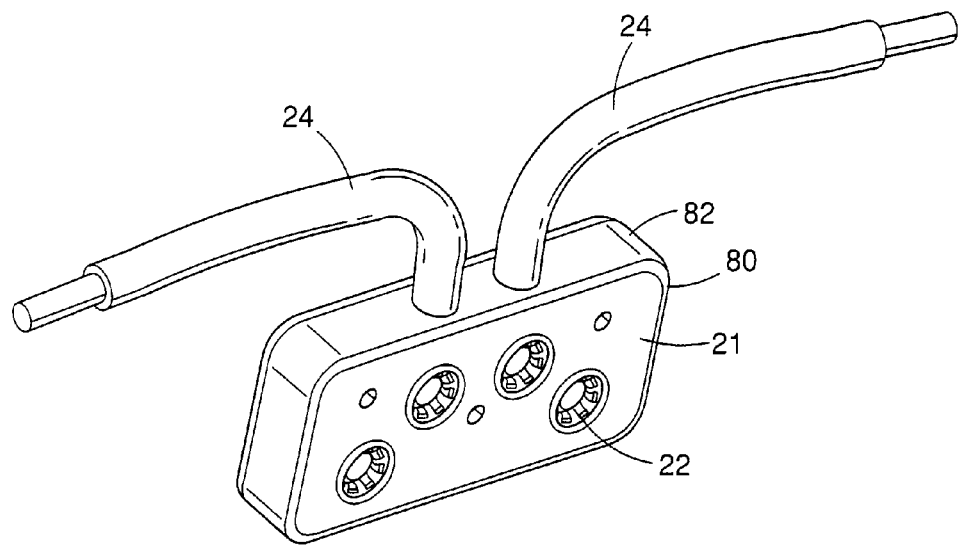
FIG. 19 is a perspective view of the electrical connector assembly of FIG. 16.
Figure 20:
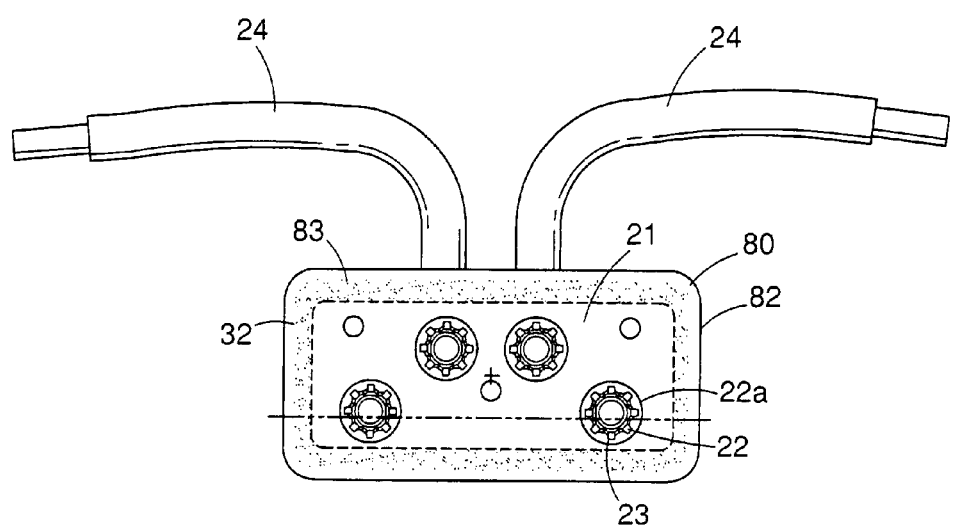
FIG. 20 is a bottom view of the electrical connector assembly of FIG. 16.
Figure 21:
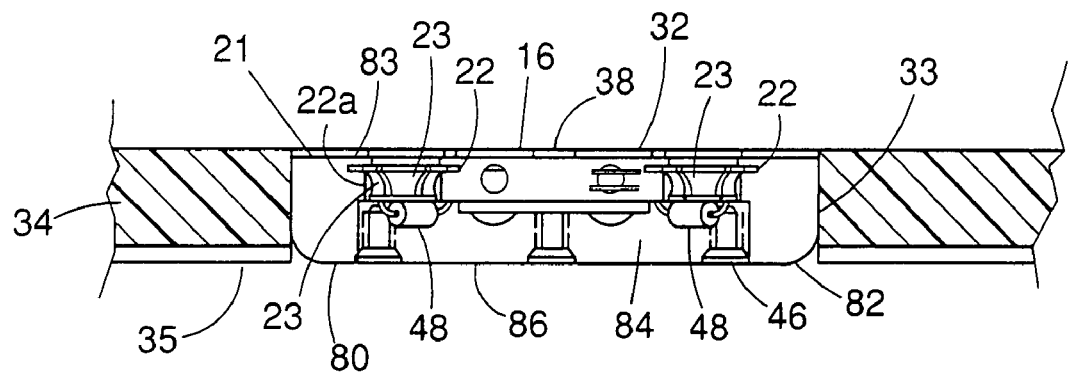
FIG. 21 is a partial sectional view of the electrical connector assembly of FIG. 16 positioned within a hole in the laminating material of the solar panel.
Figure 22:
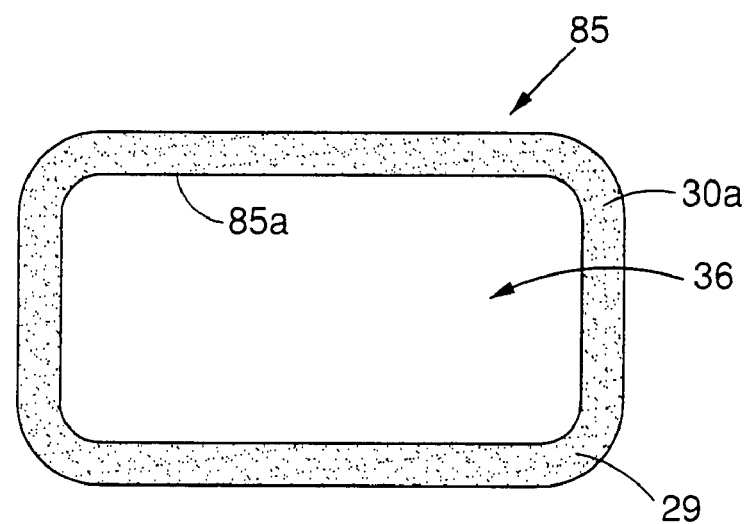
FIG. 22 is a bottom view of a square ring.
Figure 23:
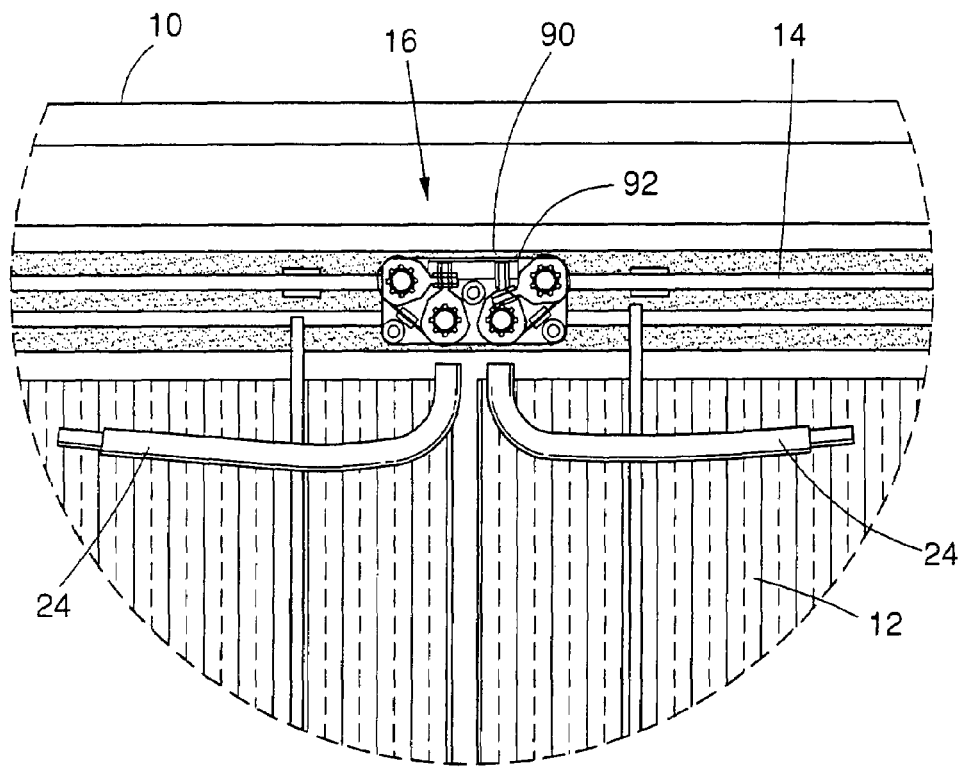
FIG. 23 is a plan view of another embodiment of an electrical connector assembly on a solar panel.

In one embodiment, the laminating material 34 and backing 35 can be applied over the electrical connector assembly 80, in an encapsulating manner (FIG. 18). If desired, a hole can be cut in the laminating material 34 and backing 35 to provide access to the electrical connector assembly 80. In another embodiment, referring to FIG. 21, a hole 33 can be cut in the laminating material 34 and backing 35, allowing the electrical connector assembly 80 and electrical engagement face 21 to be positioned within the hole 33 for securement to the surface 38 of the electrical connection region 16, and for engagement with the male electrical terminals 16a located on surface 38 at the bottom of the hole 33. The height of the laminating material 34 and backing 35 can be the same height as the electrical connector assembly 80 to result in a flush surface. Sealant can be applied around the perimeter of the electrical connector assembly 80 for sealing purposes. Alternatively, a rectangular mounting or housing member or ring 85 (FIG. 22) can be adhered to the solar panel 10 with adhesive layer 30a and used to provide an area in which the electrical connector assembly 80 can be positioned within. The ring 85 can have an inner sealing surface 85a which can engage against and seal around the perimeter of the body 82 of the electrical connector assembly 80. The ring 85 can be positioned on the solar panel 10 around electrical connection region 16, before the laminating material 34 is applied, or after the laminating material 34 is applied, and a hole 33 being cut for positioning the ring 85 therein. It is understood that the electrical connector assembly 80 can have less than four or more than four female electrical connectors 22.

Figure 24:
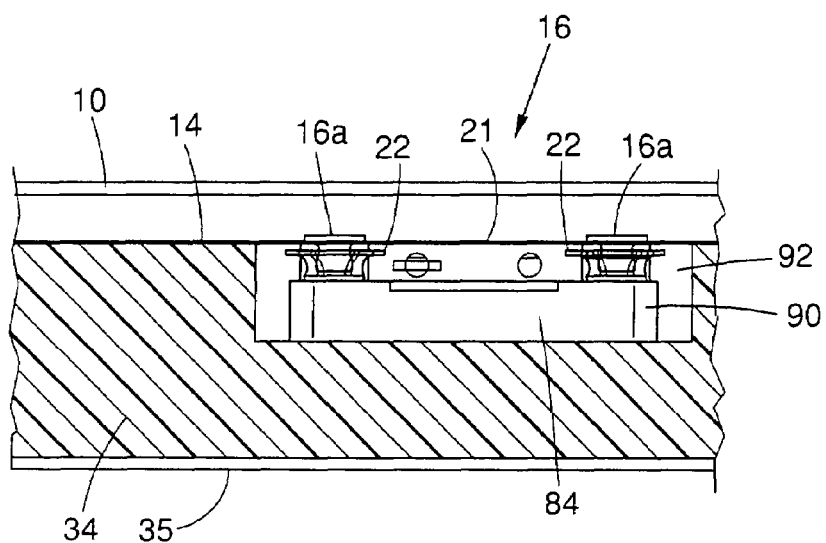
FIG. 24 is a sectional view through a laminated solar panel showing the electrical connector assembly of FIG. 23.
Figure 25:
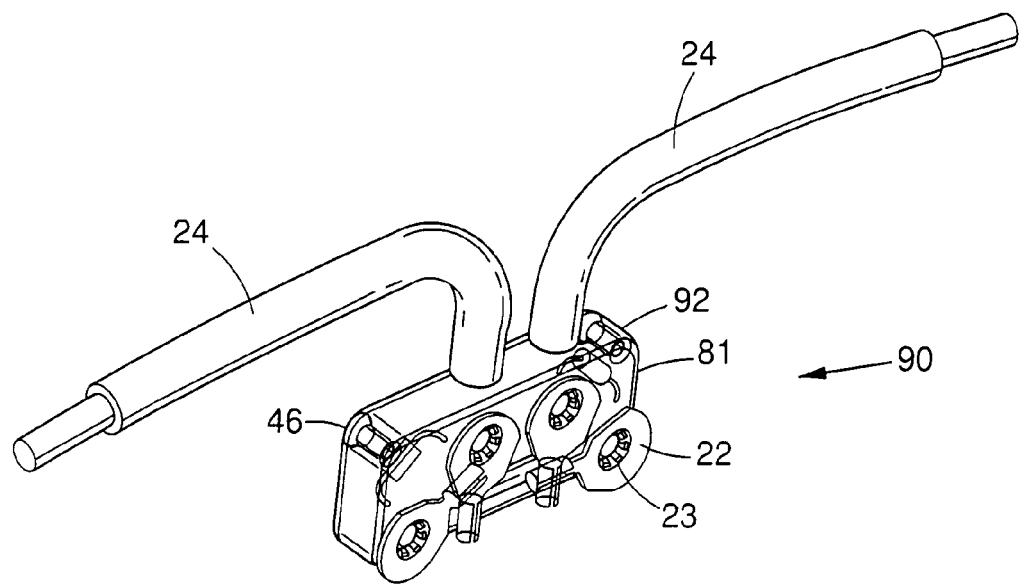
FIG. 25 is a perspective view of the electrical connector assembly of FIG. 23.
Figure 26:
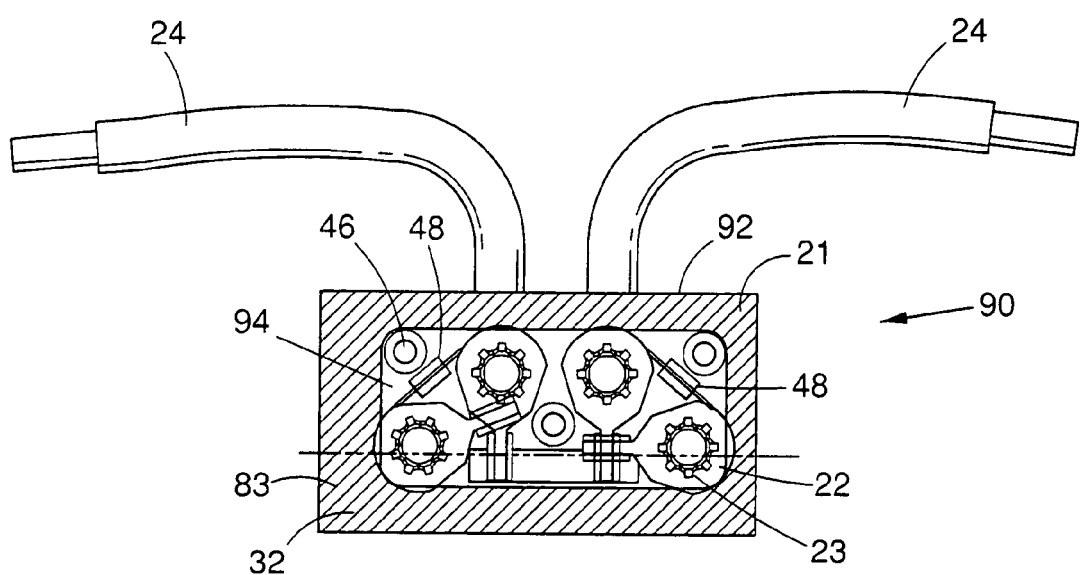
FIG. 26 is a bottom view of the electrical connector assembly of FIG. 23.
Figure 27:
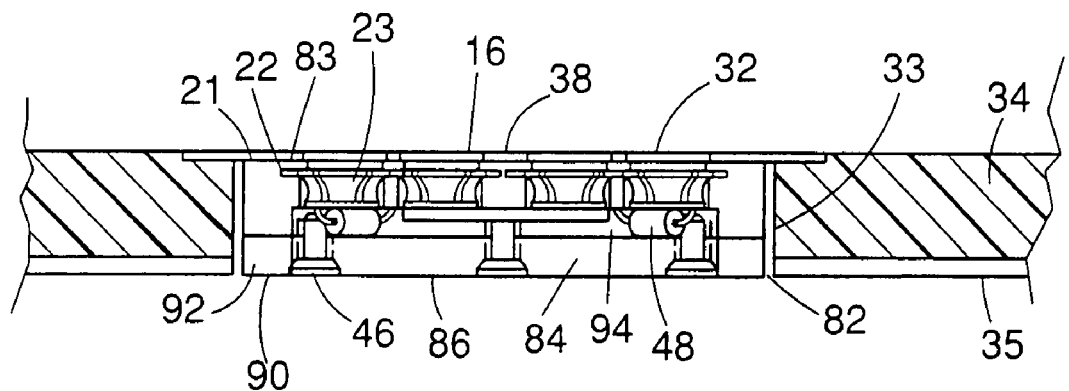
FIG. 27 is a partial sectional view of the electrical connector assembly of FIG. 23 positioned within a hole in the laminating material of the solar panel.
Figure 31:
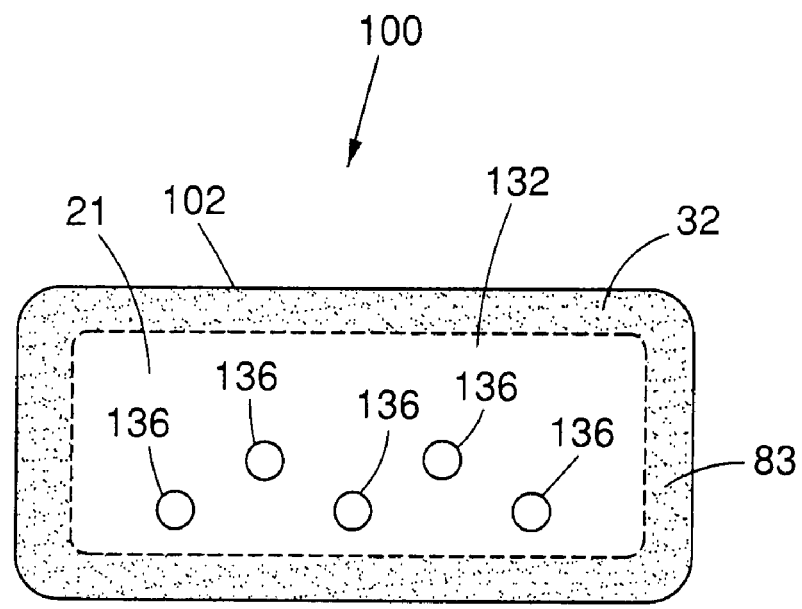
FIG. 31 is a bottom view of the electrical connector assembly of FIG. 28.
Figure 28:
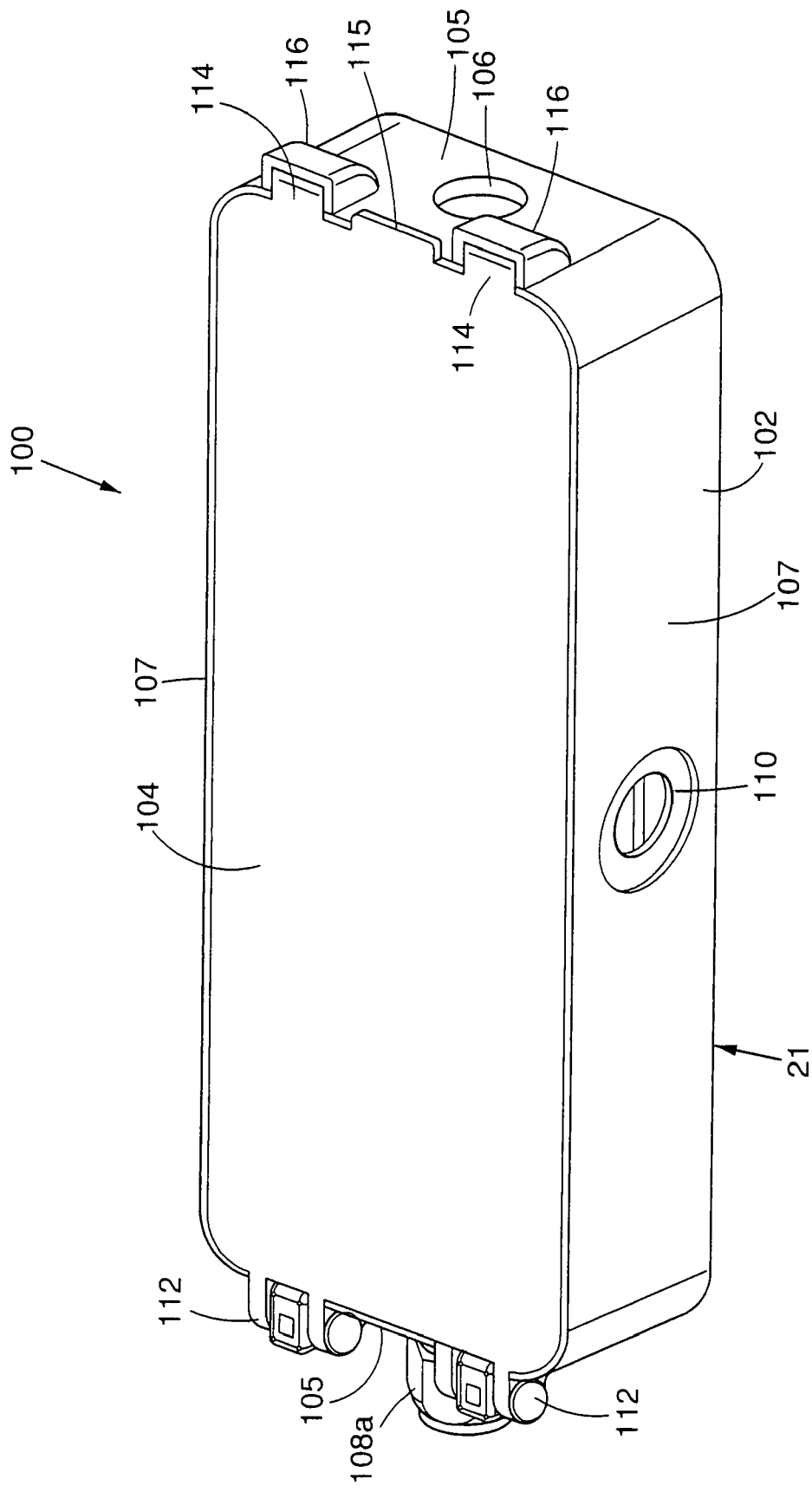
FIG. 28 is a perspective view of another electrical connector assembly.
Figure 29:
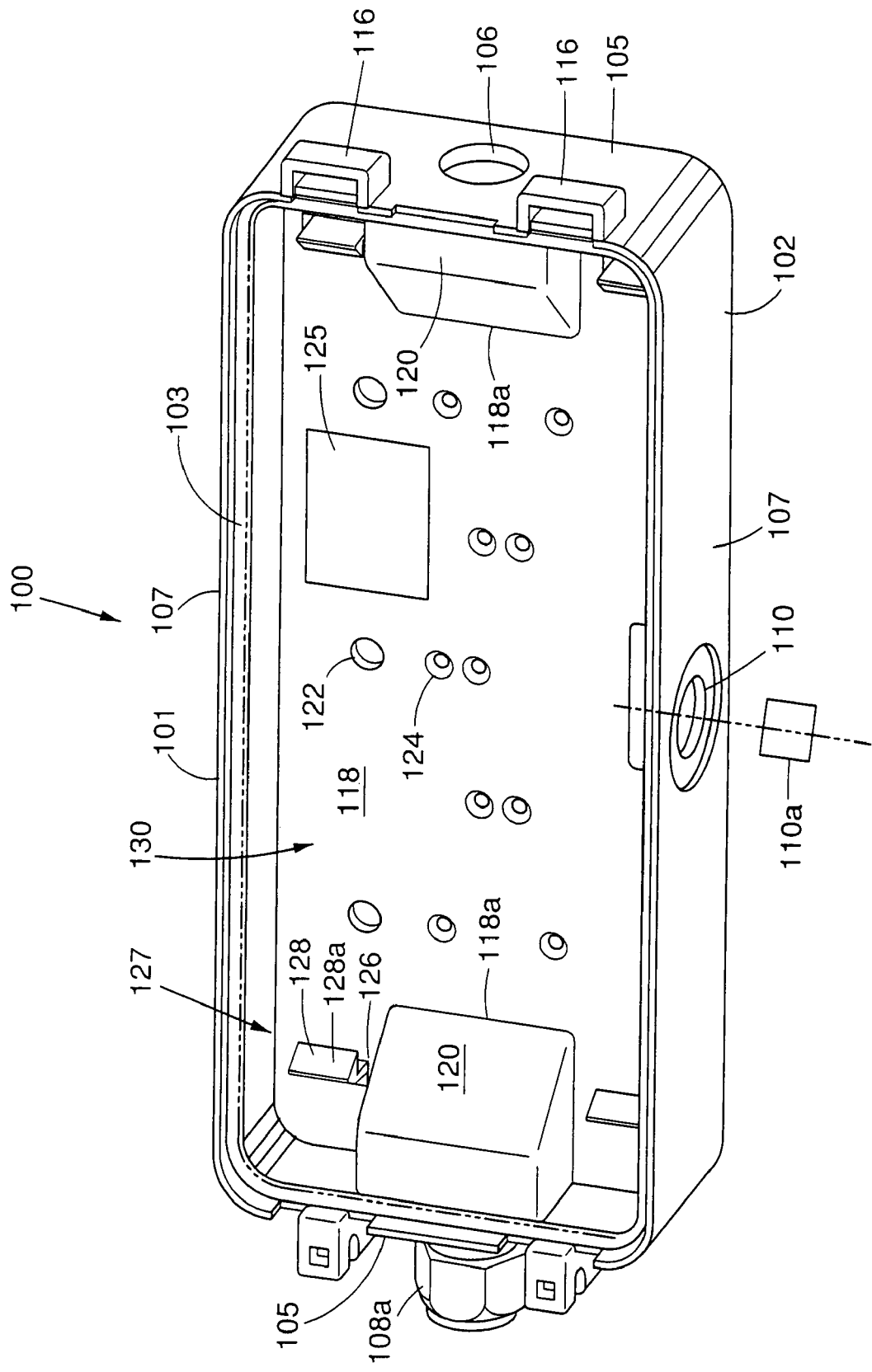
FIG. 29 is a perspective view of the electrical connector assembly of FIG. 28 with the cover removed to show a circuit board.

Referring to FIGS. 23-27, electrical junction or connector assembly 90 differs from electrical connector assembly 80 in that electrical connector assembly 90 can include a circuit board 94 electrically connected to female electrical terminals 22 and electrical cables 24. A body 92 can be positioned or molded over the female electrical terminals 22 and the circuit board 94. A cover 84 can provide access to the interior, circuitry, and to the diodes 48 for maintenance and replacement of components. The circuit board 94 can include circuitry that carries or directs the current received from the solar panel 10 through the electrical terminals 16a and out the electrical cables 24. The circuitry can regulate current and voltage, for example, in the event of over heating or a lightening strike, and can provide bypass circuitry. The circuit board 94 can eliminate the need for replaceable diodes or heat sinks. The circuit board 94 can also contain logic for other desired functions. In some embodiments, the whole circuit board 94 can be encapsulated in the body 92. The electrical connector assembly 90 can be laminated or encapsulated such as shown in FIG. 24, positioned within a hole 33 as shown in FIG. 27, or can be used in conjunction with a rectangular ring 85 (FIG. 22) in a manner similar to that described for electrical connector assembly 80.

FIGS. 28-31 depict another embodiment of an electrical junction or connector assembly 100. The electrical connector assembly 100 can have a generally rectangular housing 102 that forms a junction box. The housing 102 can have an openable access cover 104 with hinges 112 and protrusions 114 that engage latches 116 for covering an access opening 101. The access opening 101 can face or be in line with the bottom 132 of the housing 102. The electrical engagement face 21 is located on the opposite or underside of the bottom 132 and can be planar. A protrusion 115 can allow the cover 104 to be lifted or opened for allowing access within the housing 102. It is understood that other suitable covers can be employed and can be secured with fasteners. Openings 106 and 108 can be located on opposite walls, sides or ends 105 of the housing 102 to allow electrical cables 24 to enter the housing 102 for electrical connection therein. The opening 108 can have a fitting 108a as shown, to provide sealing around electrical cable 24. Such a fitting 108a can also be provided for opening 106. An opening 110 can be located on one wall or side 107 for mounting a pressure relief member, valve or vent 110a for relieving pressure differences, such as pressure built up within housing 102, or equalizing pressure. A gasket 103 can be employed to provide watertight sealing for the cover 104 and housing 102.

An electrical connector, electrical or circuit member or board 118 (FIG. 29) can be inserted in line through the access opening 101 and snapped, engaged, or secured in place in a desired alignment within the housing 102 by a locking arrangement 127. The locking arrangement 127 can be self-locking and can include a series of self-locking protrusions 128 extending from the bottom 132 of the housing 102. The protrusions 128 can engage corresponding locking holes 126 within the circuit board 118 to lock the circuit board 118 in position. This can provide a quick self-locking alignment arrangement and can fix or secure the circuit board 118 in a predetermined position relative to the housing 102. For example, four locking protrusions 128 and holes 126 are shown at four corners to provide the desire locking and alignment characteristics. The locking protrusions 128 and holes 126 can be generally rectangular in shape. The locking protrusions 128 can have angled locking heads 128a. The locking arrangement 127 can provide simultaneous horizontal and vertical locking and alignment of the circuit board 118 in one engagement, securement or snapping operation of the locking protrusions 128 with holes 126. The circuit board 118 can be inserted into housing 102 through access opening 101 in line and in the same orientation that it engages the locking arrangement 127. The locking protrusions 128 can be resilient or flexible, and can be configured to also be releasable, and can provide a quick release. It is understood that the locking protrusions 128 and holes 126 can have other shapes or configurations. In addition, the locking arrangement 127 can employ other suitable locking features. The circuit board 118 can be shaped to engage the sides 105 and 107 of the housing 102 for alignment purposes, and can be generally rectangular. The circuit board 118 can also have notches 118a for engaging surfaces or structures 120 extending from the bottom 132 of the housing 102. This can also provide alignment. The structures 120 can also provide sealing and isolate openings 106 and 108. In addition, the housing 102 can have other suitable structures for alignment. Alternatively, the circuit board 118 can be held in place by other suitable means, including fasteners.

The circuit board 118 can include electrical connectors 140 and 146 on the underside, having electrical terminals 22 with resilient circular sockets 23. The sockets 23 can be aligned with holes 122 in the circuit board 118 to provide visual alignment through the circuit board 118. The locking arrangement 127 can align the resilient circular sockets 23 with corresponding electrical connection openings or holes 136 in the bottom 132 of the housing 102 (FIG. 31) on the electrical engagement face 21 through which the male electrical terminals 16a on surface 38 of solar panel 10 can extend or protrude for engagement. The sockets 23 can be positioned in alignment, over, adjacent, or in the electrical connection holes 136, depending upon the situation at hand. The electrical engagement face 21 is on the opposite side of the housing 102 from the access opening 101 and allows for easy access and alignment for circuit board 118. A series of holes 124 in the circuit board 118 can allow the attachment and placement of diodes 48 and jumper wires or conductors relative to the electrical connectors 140 and 146 on the upper surface. The electrical connectors 140 and 146 can be held in place with securement members, tabs 134 or fasteners on the bottom of the circuit board 118. Alternatively, the electrical connectors 140 and 146 can be held in place on the bottom 132 of the housing 102.

The electrical connectors 140 and 146 can have various crimping tabs 138 for crimping to electrical wires, conductors, diodes 48 or jumpers to obtain the desired electrical circuit, including bypass circuitry. In addition, a circuit 125 electrically connected to the electrical connectors 140 and 146 can be included on the circuit board 118 for providing desired functions. The circuit 125 can be a circuit board that is electrically connected to circuit board 118, or can be circuitry formed onto the circuit board 118, and can include desired logic circuitry. Furthermore, the circuitry provided by the diodes 48, function, and arrangement thereof, can be formed onto the circuit board 118. The circuit board 118 can be formed of various suitable materials depending upon whether components are to be merely secured thereto, or formed thereon. Although the circuit board 118 has been shown to be generally planar and rectangular in shape, circuit board 118 can have other suitable shapes, and can be shaped to fit in different shaped housings 102. In addition, the electrical connectors 140 and 146 can be positioned on the upper side of circuit board 118.

Figure 30:
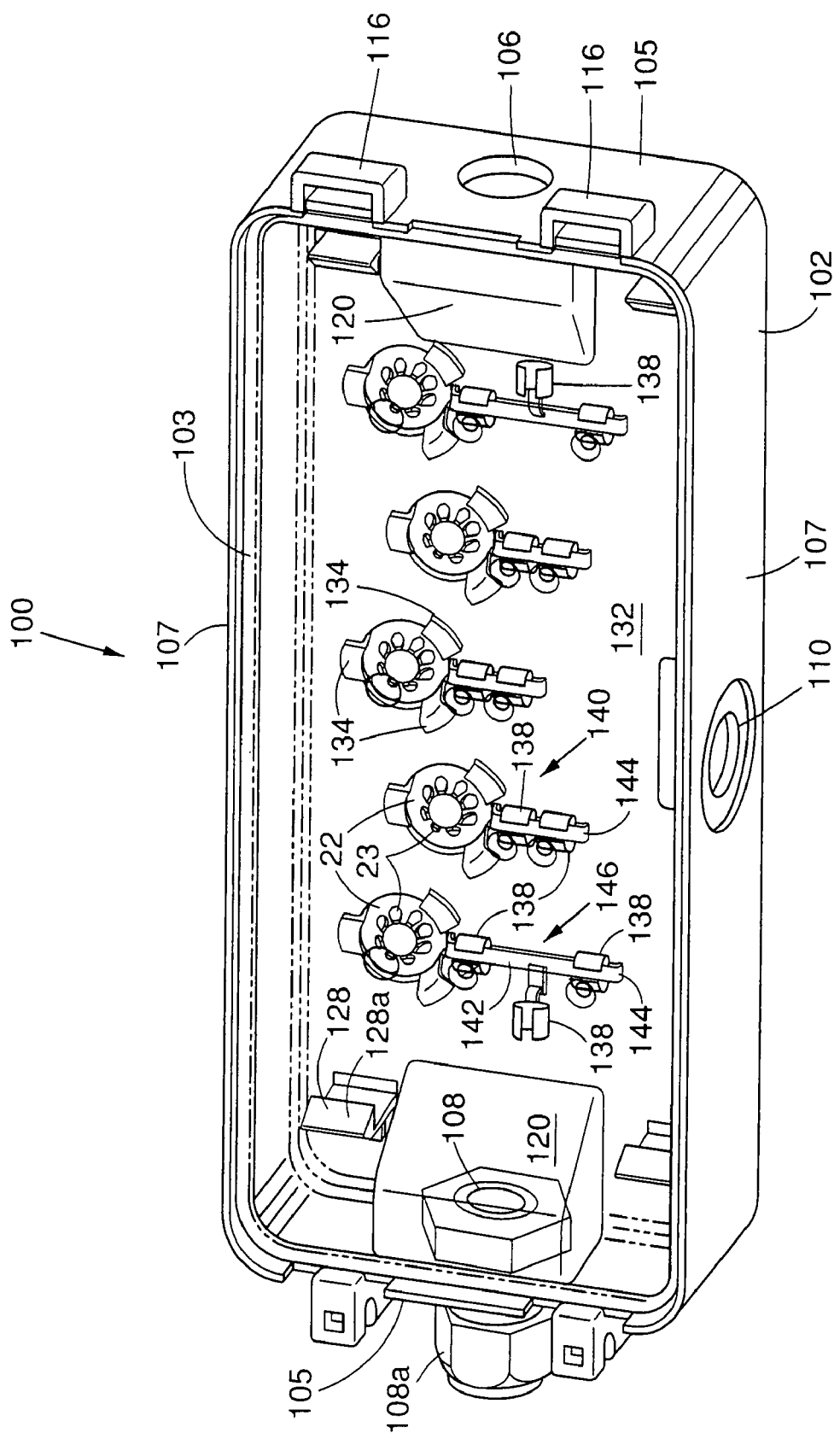
FIG. 30 is a perspective view of the electrical connector assembly of FIG. 28 with the cover and circuit board removed.

The electrical connection holes 136 in the bottom of the housing 102 can be aligned with, or positioned over or around the corresponding mating male terminals 16a on the surface 38 of the electrical connection region 16 of the solar panel 10. The mating male terminals 16a can protrude through the holes 136 into the housing 102 and engage the sockets 23 of the female electrical connectors 140 and 146. The access opening 101, the holes 122 in the circuit board 118, and the electrical connection holes 136 in the bottom of the housing 102, can together allow inline visual alignment of the female circular sockets 23 with the mating male terminals 16a. Depending upon the number of electrical connectors 140 and 146, the configuration and positioning, different circuit boards 118 with different electrical circuitry and electrical connector configurations can be positioned and secured in place into housing 102. Although five sockets 23 are shown in FIG. 30, it is understood that more than five or less than five can be employed and positioned in different patterns. It is understood that the electrical connectors can have other suitable configurations depending upon the desired circuit.

The underside of the bottom 132 of the housing 102 on the electrical engagement face 21, can have an adhesive layer 32, such as silicone or an adhesive tape, for securing the bottom 132 of the housing 102 in place to the surface 38 of the electrical connection region 16. This can also provide a planar sealing surface 83 on the electrical engagement face 21 around the electrical connector sockets 23 and the male electrical terminals 16a, for sealing out moisture. Adhesives or sealants can also be applied at the time of adhesion to a surface 38. The electrical connector assembly 100 can be secured to the solar panel 10 in various manners such as those previously discussed. In one embodiment, the housing 102 can be positioned in place after lamination and can be inserted into a hole 33. During installation, the housing 102 can be first adhered, secured, or sealed to the surface 38 of the solar panel 10 by adhesive layer 32. The circuit board 118 can then be snapped into the housing 102, and at the same time the female electrical terminals 22 engage the male electrical terminals 16a protruding from the surface 38 of the electrical connection region 16 at the bottom of the hole 33. Alternatively, the circuit board 118 can already be positioned or secured within the housing 102, and then the housing 102 is secured to the surface 38 while at the same time the female electrical terminals 22 engage the male electrical terminals 16a. A ring 85 (FIG. 22) can be employed if desired. In addition, the ring 85 can be used before the laminating material is applied. In another embodiment, the housing 102 can be adhered to the electrical connection region 16 and then the laminating material 34 is applied around the housing 102. Different circuit boards 118 with different electrical connector configurations can be used in conjunction with different male terminal 16a patterns. The electrical face 21 can have a series of electrical connection holes 136 which can be used with the different electrical connection configurations. Alternatively, the holes 136 can be different for different housings 102.

While this invention has been particularly shown and described with references to example embodiments thereof, it will be understood by those skilled in the art that various changes in form and details may be made therein without departing from the scope of the invention encompassed by the appended claims.

For example, the electrical terminals on the solar panel 10 can be female connectors and the electrical terminals on the electrical connector assemblies can be male terminals. In addition, other suitable types of electrical terminals can be employed, such as blade or pin connectors, etc. Furthermore, although particular shapes have been described for embodiments of the electrical connector assembles, it is understood that other suitable shapes are contemplated. The rings 30 and 85 can be of other suitable shapes, including other curved and polygonal shapes, and combinations of curved and polygonal shapes. Also, although adhesives have been described for securement of components of the electrical connector assemblies to the solar panels, it is understood that other means of securement can be employed, including the use of fasteners. In some embodiments, seals such as "O" rings can be used for sealing purposes. In situations where electrical terminals extend above the laminating materials of the solar panels, the electrical connector assemblies do not need to be positioned inside holes in the laminating material. Although the electrical connector assembles have been described for electrically connecting solar panels, it is understood that the electrical connector assemblies can be used in other fields for electrically connecting other types of components.

What is claimed is:

1. An electrical connector assembly comprising:
an electrical connector body having a closed outer perimeter with linear sections, and an upper surface and a bottom side bounded by the outer perimeter, the bottom side being continuously planar and opposite to the upper surface;
multiple female electrical terminals with circular resilient sockets contained within the body, the circular resilient sockets being positioned within a continuously planar electrical engagement face of the body formed by the continuously planar bottom side of the body, the electrical engagement face forming a planar sealing surface surrounding the circular resilient sockets; and
a solar panel having an electrical connection region with a planar mounting surface and protruding circular male terminals for engagement with the circular resilient sockets of the female electrical terminals, said continuously planar bottom side of the body for engaging the planar mounting surface of the solar panel in planar surface engagement for providing planar surface sealing therebetween, and around the circular resilient sockets and the circular male terminals.

2. The assembly of claim 1 further comprising an adhesive layer on the planar sealing surface.

3. The assembly of claim 2 in which the female electrical terminals are electrically connected in electrical circuitry including bypass circuitry.

4. The assembly of claim 3 in which the electrical circuitry includes diodes.

5. The assembly of claim 3 in which the electrical terminals are electrically connected to a circuit board containing the electrical circuitry.

6. The assembly of claim 3 further comprising a removable cover for providing access to the electrical circuitry.

7. The assembly of claim 1 further comprising electrical cables electrically connected to the electrical terminals and extending from the connector body.

8. The assembly of claim 1 in which the solar panel includes laminating material, the connector body being positioned within a hole in the laminating material for engaging the circular male terminals, the circular male terminals being located at a bottom of the hole.

9. A method of forming an electrical connection with an electrical connector assembly comprising:
containing multiple female electrical terminals with circular resilient sockets within an electrical connector body having a closed outer perimeter with linear sections, and an upper surface and a bottom side bounded by the outer perimeter, the bottom side being continuously planar and opposite to the upper surface, the circular resilient sockets being positioned within a continuously planar electrical engagement face of the body formed by the continuously planar bottom side of the body, the electrical engagement face forming a planar sealing surface surrounding the circular resilient sockets; and
electrically connecting the electrical connector body to a solar panel having an electrical connection region with a planar mounting surface from which mating circular male terminals protrude by electrically engaging the circular resilient sockets with the mating circular male terminals, said continuously planar bottom side of the body engaging the planar mounting surface of the solar panel in planar surface engagement for providing planar surface sealing therebetween, and around the circular resilient sockets and the circular male terminals.

10. The method of claim 9 further comprising securing the electrical engagement face with an adhesive layer on the planar sealing surface.

11. The method of claim 10 further comprising electrically connecting the female electrical terminals in electrical circuitry including bypass circuitry.

12. The method of claim 11 further comprising providing the electrical circuitry with diodes.

13. The method of claim 11 further comprising electrically connecting the female electrical terminals to a circuit board containing the electrical circuitry.

14. The method of claim 11 further comprising providing access to the electrical circuitry with a removable cover.

15. The method of claim 9 further comprising electrically connecting the female electrical terminals to electrical cables extending from the connector body.

16. The method of claim 9 in which the solar panel includes laminating material, the method further comprising positioning the connector body within a hole in the laminating material for engaging the circular male terminals, the circular male terminals being located at a bottom of the hole.

* * * * *